(12) United States Patent
Kitamoto et al.

(10) Patent No.: US 7,333,867 B2
(45) Date of Patent: Feb. 19, 2008

(54) SUBSTRATE PROCESSING SYSTEM MANAGING APPARATUS INFORMATION OF SUBSTRATE PROCESSING APPARATUS

(75) Inventors: Toru Kitamoto, Kyoto (JP); Kenji Kamei, Kyoto (JP); Hidekazu Inoue, Kyoto (JP); Tetsuya Hamada, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 11/368,862

(22) Filed: Mar. 6, 2006

(65) Prior Publication Data

US 2006/0241803 A1 Oct. 26, 2006

Related U.S. Application Data

(62) Division of application No. 10/189,975, filed on Jul. 2, 2002, now Pat. No. 7,047,100.

(30) Foreign Application Priority Data

Jul. 5, 2001 (JP) ............................ P2001-205109
Jul. 5, 2001 (JP) ............................ P2001-205110
Jul. 5, 2001 (JP) ............................ P2001-205111

(51) Int. Cl.
*G06F 19/00* (2006.01)
(52) U.S. Cl. .................. 700/96; 700/110; 700/121
(58) Field of Classification Search .............. 700/96, 700/121, 110; 438/4; 353/53
See application file for complete search history.

(56) References Cited

U.S. PATENT DOCUMENTS

| 5,970,492 | A | * | 10/1999 | Nielsen | 707/10 |
| 6,795,161 | B2 | * | 9/2004 | Ogura et al. | 355/53 |
| 6,864,953 | B2 | * | 3/2005 | Uzawa | 355/53 |
| 6,873,397 | B2 | * | 3/2005 | Yabu | 355/53 |
| 7,062,343 | B2 | * | 6/2006 | Ogushi et al. | 700/110 |
| 2001/0043666 | A1 | * | 11/2001 | Watanabe et al. | 378/34 |
| 2002/0006675 | A1 | * | 1/2002 | Shigaraki | 438/4 |
| 2002/0022969 | A1 | * | 2/2002 | Berg et al. | 705/1 |

* cited by examiner

*Primary Examiner*—Zoila Cabrera
*Assistant Examiner*—Steven R. Garland
(74) *Attorney, Agent, or Firm*—Ostrolenk, Faber, Gerb & Soffen, LLP

(57) ABSTRACT

A substrate processing system comprises a substrate processing apparatus and a support computer, which are connected to a network respectively. Updated countermeasure information is accumulated in the support computer by a system administrator. When the substrate processing apparatus causes a failure, content of the failure is displayed on a display part while an alarm processing part controls process according to an alarm definition file. Further, a countermeasure information acquisition part requires updated countermeasure information against the failure from the support computer. In response to this, countermeasure information distribution part of the support computer transmits updated countermeasure information. Thus, updated countermeasure information can be read instantly when a failure occurs.

9 Claims, 20 Drawing Sheets

F I G . 4
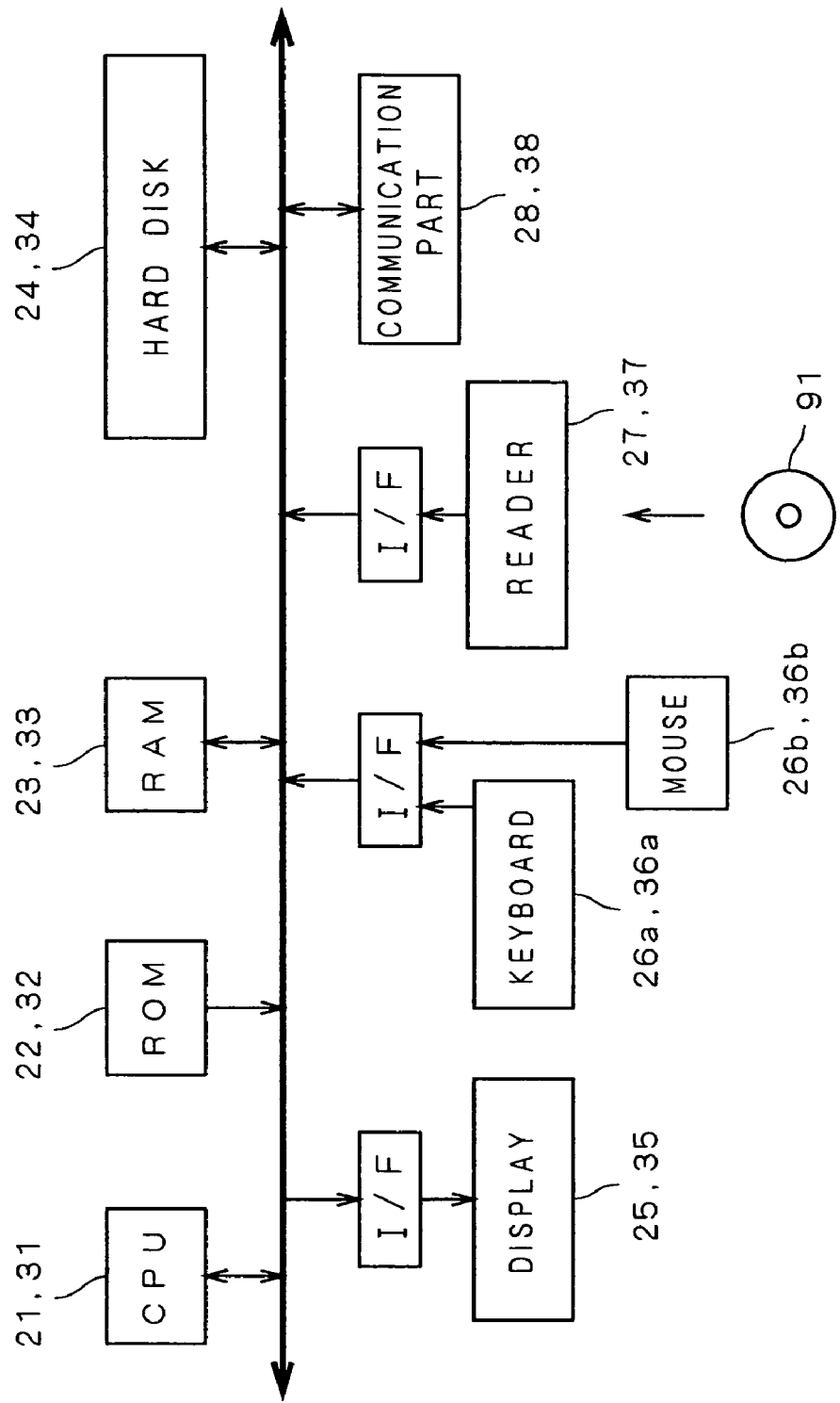

F I G . 6

161

| ALARM CODE | DISPLAY TEXT | SYSTEM CONTROL CODE | OUTPUT LOG FILE CODE |
|---|---|---|---|
| 001 | XXXXXXXXXX | 1 | 1, 2 |
| 002 | XXXXXXXX | 2 | 2, 4 |
| 003 | XXXXXX | 4 | 2 |
| 004 | XXXXXXXXXX | 1 | 1, 2, 3 |
| 005 | XXXXXXXX | 3 | 2, 4 |
| 006 | XXXXXXXX | 5 | 1, 4 |
| 007 | XXXXXX | 2 | 2, 3 |

| No. D0 | DATE D1 | APPARATUS D2 | UNIT D3 | VERSION D4 | CONTENTS OF FAILURE D5 | LOG D6 |
|---|---|---|---|---|---|---|
| 1001 | 01/04/07 12:11 | 8000 | 3 | 1.00 | xxxxxxxxxxx | aaa |
| 1002 | 01/04/08 12:22 | 8001 | 1 | 1.00 | xxxxxxxxxxx | bbb |
| 1003 | 01/04/08 14:30 | 8003 | 4 | 1.00 | xxxxxxxxxxx | ccc |
| 1200 | 01/05/08 00:30 | 8000 | 5 | 1.10 | xxxxxxxxxxx | zzz |

| No. D10 | OBJECT APPARATUS D11 | UNIT D12 | ANALYTIC RESULT D13 | COUNTERMEASURE D14 | PROGRAM SCHEDULE D15 | VERSION D16 |
|---|---|---|---|---|---|---|
| 1001 | 8000 | 3 | xxxxxxxx | xxxxxxxx | 01/04/30 | 1.10 |
| 1002 | 8001 | 1 | xxxxxxxx | xxxxxxxx | 01/04/30 | 1.10 |
| 1003 | 8003 | 4 | xxxxxxxx | xxxxxxxx | 01/05/01 | 1.20 |
| 1200 | 8000 | 5 | xxxxxxxx | xxxxxxxx | 01/06/01 | 1.30 |

| ALARM CODE | DISPLAY TEXT | SYSTEM CONTROL CODE | COUNTERMEASURE INFORMATION | DATE OF UPDATING |
|---|---|---|---|---|
| 001 | xxxxxxxxxx | 1 | A001 | 01/04/01 |
| 002 | xxxxxxxxxx | 2 | A002 | 01/04/01 |
| 003 | xxxxxxxxxx | 4 | A003 | 01/06/04 |
| 004 | xxxxxxxxxx | 1 | A004 | 01/04/01 |
| 005 | xxxxxxxxxx | 3 | A005 | 01/04/01 |
| 006 | xxxxxxxxxx | 5 | A006 | 01/05/10 |
| 007 | xxxxxxxxxx | 2 | A007 | 01/04/01 |

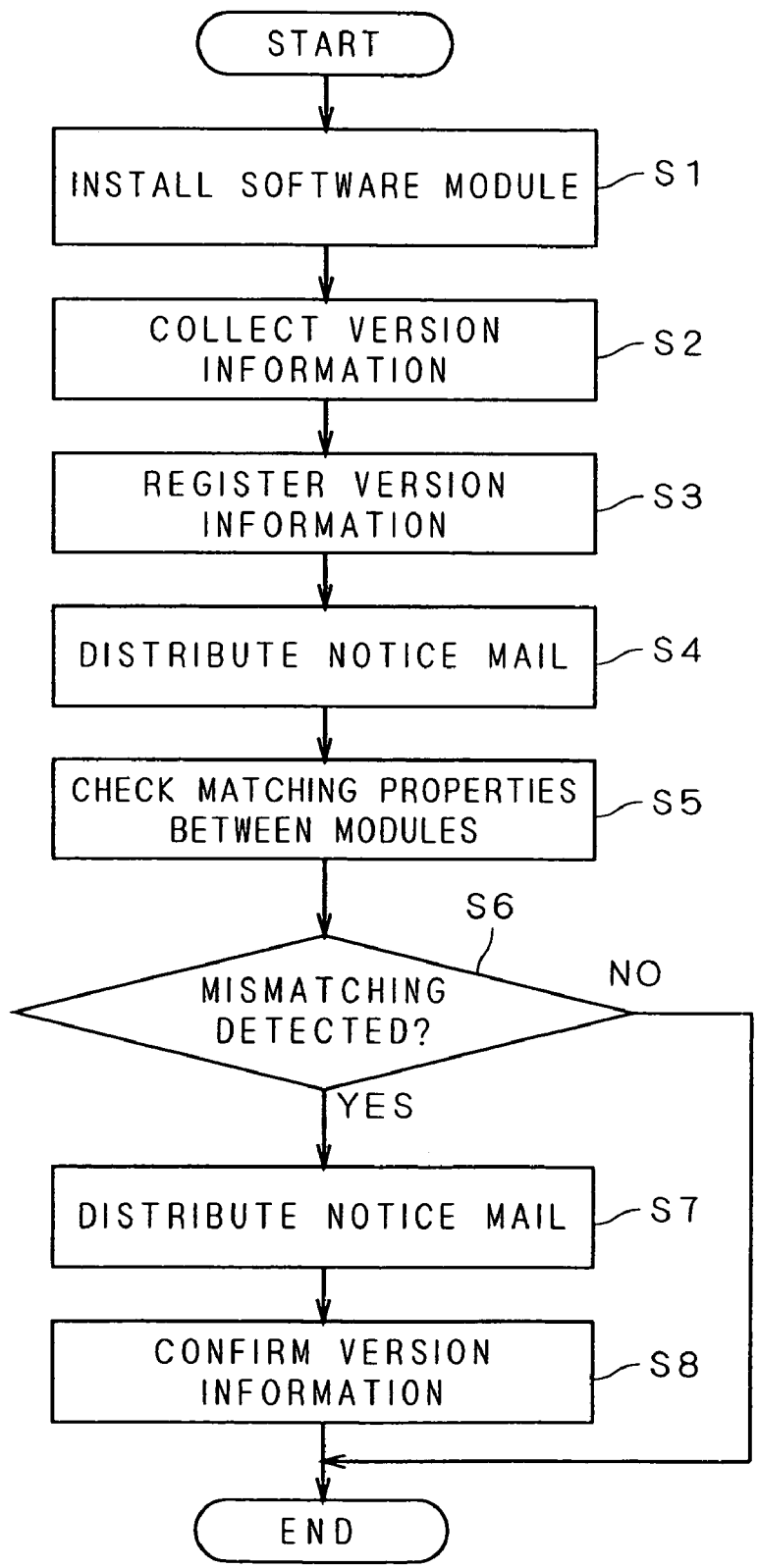
F I G . 15

FIG. 16

| APPARATUS | SYSTEM VERSION | DATE OF INSTALLATION |
|---|---|---|
| 8100 | 1.00 | 01/04/12 |
| 8100 | 1.10 | 01/04/20 |
| 8101 | 1.00 | 01/04/12 |
| ... | ... | ... |
| 8200 | 2.00 | 01/05/20 |

241

| APPARATUS | SYSTEM VERSION | CATEGORY | VERSION CLASSIFICATION | VERSION |
|---|---|---|---|---|
| 8101 | 1.00 | SYSTEM CONTROL | STANDARD | 1.0.0.1 |
| 8101 | 1.00 | SPIN CONTROL | STANDARD | 1.1.0.1 |
| ... | ... | ... | ... | ... |
| 8101 | 1.00 | CHEMICAL SOLUTION CONTROL | CUSTOM-BUILT | 1.0.0.3 |

FIG. 17

| SYSTEM VERSION | CATEGORY | VERSION CLASSIFICATION | VERSION |
|---|---|---|---|
| 1.00 | SYSTEM CONTROL | STANDARD | 1.0.0.1 |
| 1.00 | SYSTEM CONTROL | CUSTOM-BUILT A | 1.0.0.2 |
| 1.00 | SPIN CONTROL | STANDARD | 1.1.0.1 |
| 1.00 | SPIN CONTROL | CUSTOM-BUILT C | 1.1.0.2 |
| ... | ... | ... | ... |
| 1.00 | CHEMICAL SOLUTION CONTROL | CUSTOM-BUILT E | 1.0.0.3 |

242

| SYSTEM VERSION | RELEASE INFORMATION |
|---|---|
| 1.00 | xxxxxxxxx |
| 1.10 | xxxxxxxxx |
| 1.11 | xxxxxxxxx |
| ... | ... |
| 2.00 | xxxxxxxxx |

| APPARATUS | SYSTEM VERSION | CATEGORY | VERSION CLASSIFICATION | VERSION |
|---|---|---|---|---|
| 8101 | 1.00 | SYSTEM CONTROL | STANDARD | 1.0.0.1 |
| 8101 | 1.00 | SPIN CONTROL | STANDARD | 1.1.0.1 |
| ... | ... | ... | ... | ... |
| 8101 | 1.00 | CHEMICAL SOLUTION CONTROL | CUSTOM-BUILT | 1.0.0.3 |

| APPARATUS | SYSTEM VERSION | DATE OF INSTALLATION |
|---|---|---|
| 8100 | 1.00 | 01/04/12 |
| 8100 | 1.10 | 01/04/20 |
| 8101 | 1.00 | 01/04/12 |
| ... | ... | ... |
| 8200 | 2.00 | 01/05/20 |

SUBSTRATE PROCESSING SYSTEM MANAGING APPARATUS INFORMATION OF SUBSTRATE PROCESSING APPARATUS

CROSS REFERENCE TO RELATED APPLICATION

This application is a divisional of U.S. application Ser. No. 10/189,975 filed Jul. 2, 2002 now U.S. Pat. No. 7,047,100 entitled SUBSTRATE PROCESSING SYSTEM MANAGING APPARATUS INFORMATION OF SUBSTRATE PROCESSING APPARATUS, which claims the benefit of Japanese Appln. S.N. P2001-205109 filed Jul. 1, 2001, Japanese Appln. S.N. P2001-205110 filed Jul. 1, 2001 and Japanese Appln. S.N. P2001-205111 filed Jul. 1, 2001, the contents of which are incorporated by this reference.

BACKGROUND OF THE INVENTION

1. Field of the Invention

The present invention relates to a network communication technique connecting a substrate processing apparatus performing prescribed processing on a semiconductor substrate, a glass substrate for a liquid crystal display, a glass substrate for a photomask or a substrate for an optical disk (hereinafter simply referred to as "substrate") and a computer with each other through a network.

2. Description of the Background Art

A product such as a semiconductor device or a liquid crystal display is manufactured by performing a series of processing such as cleaning, resist application, exposure, development, etching, formation of an interlayer dielectric film and heat treatment on a substrate. In general, a substrate processing apparatus having a built-in resist coating unit, a built-in developing unit etc. performs such processing. A transport robot provided on the substrate processing apparatus successively transports a substrate to the respective units, thereby performing the series of processing on the substrate.

Such substrate processing is automatically controlled, and the substrate processing apparatus generally comprises a unit control part individually controlling the processing units in addition to a system control part controlling the overall apparatus. Control software mounted on the substrate processing apparatus is formed by software modules installed in the system control part and the unit control part respectively. In other words, the software module installed in the system control part constructs a system controller controlling the overall apparatus, and the software modules installed in the unit control part construct a unit controller individually controlling the respective processing units.

Each of the software modules installed in the system control part and the unit control part has a specific version. Each software module is intentionally subjected to version upgrades or modifications. The version of a specific software module may be temporarily revised for the convenience of support in a factory having the substrate processing apparatus.

When revising the version of such a software module, it is important to keep matching properties between all software modules installed in the substrate processing apparatus. If no matching properties are kept between the software module, the substrate processing apparatus may malfunction or stop due to trouble in the controller. Therefore, any software module is intentionally subjected to version upgrades while keeping matching properties between the software modules.

In this case, however, a software module of a false version may be installed due to erroneous operation. When the version of a specific software module is temporarily revised on the support site, the structure of the software module may differ from the intended module structure. In this case, matching properties between the software modules may not necessarily be kept, resulting in a failure of the apparatus such as a malfunction or stoppage.

When the substrate processing apparatus causes a failure, an unexpectedly long time may be required for analyzing the cause of the failure unless version information of the software modules mounted on the apparatus is quickly and correctly grasped.

The aforementioned substrate processing apparatus regularly sequentially records various types of information as to operation such as information on substrate processing steps and operational information for an operator as log files.

These log files are recorded every time a predetermined event takes place along with the time of the event, to indicate time-series operation information as to operation of the substrate processing apparatus. Therefore, information on past operation of the substrate processing apparatus can be confirmed post hoc by referring to the contents recorded in the log files. Particularly when the substrate processing apparatus causes a failure, the cause of the failure can be analyzed by referring to the contents recorded in the log files recorded in advance of the failure.

In general, the following procedure is employed in order to deal with a failure taking place the substrate processing apparatus:

1. The operator recognizes the occurrence of the failure through a tower lamp or a buzzer of the substrate processing apparatus.

2. The operator posts the occurrence of the failure to a field service engineer of a vendor.

3. The field service engineer goes to the substrate processing factory having the substrate processing apparatus and grasps the situation of the failure.

4. If the field service engineer cannot deal with the failure ad loc., he/she acquires the log files of the substrate processing apparatus by outputting the same to a recording medium and creates a failure report document indicating the specific situation of the failure.

5. The field service engineer transmits the aforementioned log files and the failure report document to a failure analyst at a remote place such as a support center through an electronic mail or the like.

6. The failure analyst refers to the log files and the failure report document, to analyze the cause of the failure and study a countermeasure against the failure.

7. The failure analyst posts the results of the failure analysis and the countermeasure to the field service engineer.

Thus, also when a failure takes place, it is possible to analyze the cause of the failure by referring to the log files, for taking a proper countermeasure against the failure.

However, a considerable time is required for operation other than the analysis (6) of the cause of the failure through the log files in the aforementioned procedure, leading to requirement for a long time for completing the analysis and posting the countermeasure to the field service engineer. Particularly when a significant failure takes place, the substrate processing apparatus must be stopped over a long time until the countermeasure is posted to the field service engineer, disadvantageously leading to remarkable reduction of the production efficiency for substrates.

A long time is also required for acquiring the log files following the occurrence of the failure. The maximum data quantity of the log files is previously set and hence the recorded contents necessary for analyzing the failure may have already been deleted when the log files are acquired. When rendering the log files preservable over a long period in order to deal with this, the data quantity of the log files acquired upon occurrence of the failure is remarkably increased, leading to a long time required for transmitting the log files to the failure analyst and retrieving the necessary recorded contents.

A substrate processing apparatus having a built-in resist coating unit, a built-in developing unit or the like may previously store countermeasure information against failures assumed therein. This countermeasure information includes the causes of failures, operation methods corresponding to the failures and constraints related to the failures. Thus, even an operator having insufficient knowledge of this apparatus can restore the apparatus from any failure by properly reading the aforementioned countermeasure information following the occurrence of the failure.

However, the substrate processing apparatus stores the countermeasure information as of the date of introduction (shipment) of the apparatus. When an unexpected failure not assumed at the time of introduction or the like takes place, therefore, it may be impossible to properly deal with the failure through the stored countermeasure information. If the apparatus is restored from the failure according to improper countermeasure information, the state of the substrate processing apparatus may be further deteriorated to retard the restoration.

In order to deal with this, the vendor distributes latest countermeasure information newly recognized with reference to failures as additional information through documents or the like. However, this additional information, distributed by mail or the like, cannot be immediately acquired when the latest countermeasure information is necessary.

Further, it follows that the distributed latest countermeasure information is managed independently of the countermeasure information stored in the apparatus and hence the information cannot be unified. Thus, it is difficult to select the latest countermeasure information necessary when a failure occurs in practice.

SUMMARY OF THE INVENTION

The present invention is directed to a substrate processing system connecting a substrate processing apparatus and a computer with each other to be capable of making communication through a network.

A substrate processing system according to an aspect of the present invention, having a substrate processing apparatus and a computer processing apparatus information of the substrate processing apparatus connected to a network, comprises an apparatus information storage element storing the acquired apparatus information and an apparatus information uncasing element rendering the apparatus information stored in the apparatus information storage element readable from the computer through the network.

The apparatus information of the regularly operating substrate processing apparatus can be read through the network in the stored state, whereby the apparatus information can be readily grasped from a remote place.

According to another aspect of the present invention, a substrate processing system comprising a substrate processing apparatus comprising a processing unit performing prescribed processing on a substrate, a system control part controlling overall the apparatus and a unit control part individually controlling the processing unit, a computer connected with the substrate processing apparatus through a network and a matching property confirmation element confirming the matching properties of software modules presently installed in the system control part and the unit control part respectively when a software module is installed in the system control part or the unit control part.

A failure resulting from mismatching between software modules installed in the substrate processing apparatus can be prevented.

According to still another aspect of the present invention, a substrate processing system comprising a substrate processing apparatus capable of making communication through a network, comprises an additional information storage element storing additional information, relevant to the substrate processing apparatus, additionally distributed by a vendor of the substrate processing apparatus, and an additional information acquisition element acquiring stored the additional information through the network.

The additional information additionally distributed by the vendor of the substrate processing apparatus can be immediately acquired.

The present invention is also directed to a substrate processing method connecting a substrate processing apparatus and a computer with each other to be capable of making communication through a network.

The present invention is further directed to a substrate processing apparatus connected with a computer to be capable of making communication through a network.

Accordingly, an object of the present invention is to make operation information of a substrate processing apparatus immediately readable from a remote place.

Another object of the present invention is to prevent a failure resulting from mismatching between software modules installed in a substrate processing apparatus.

Still another object of the present invention is to make additional information immediately acquirable whenever the same is necessary.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 illustrates the basic structures of an information storage server and a support computer;

FIG. 6 illustrates an exemplary alarm definition file;

FIG. 7 illustrates an exemplary failure information database;

FIG. 9 illustrates an exemplary countermeasure information database;

FIG. 12 illustrates an exemplary alarm definition file in the second embodiment;

FIG. 15 illustrates the flow of processing in the substrate processing system according to the third embodiment;

FIG. 16 illustrates an exemplary version management table;

FIG. 17 illustrates an exemplary confirmation table;

FIG. 18 illustrates another exemplary version management table;

DESCRIPTION OF THE PREFERRED EMBODIMENTS

Embodiments of the present invention are now described with reference to the drawings.

1. First Embodiment

Figure 1:
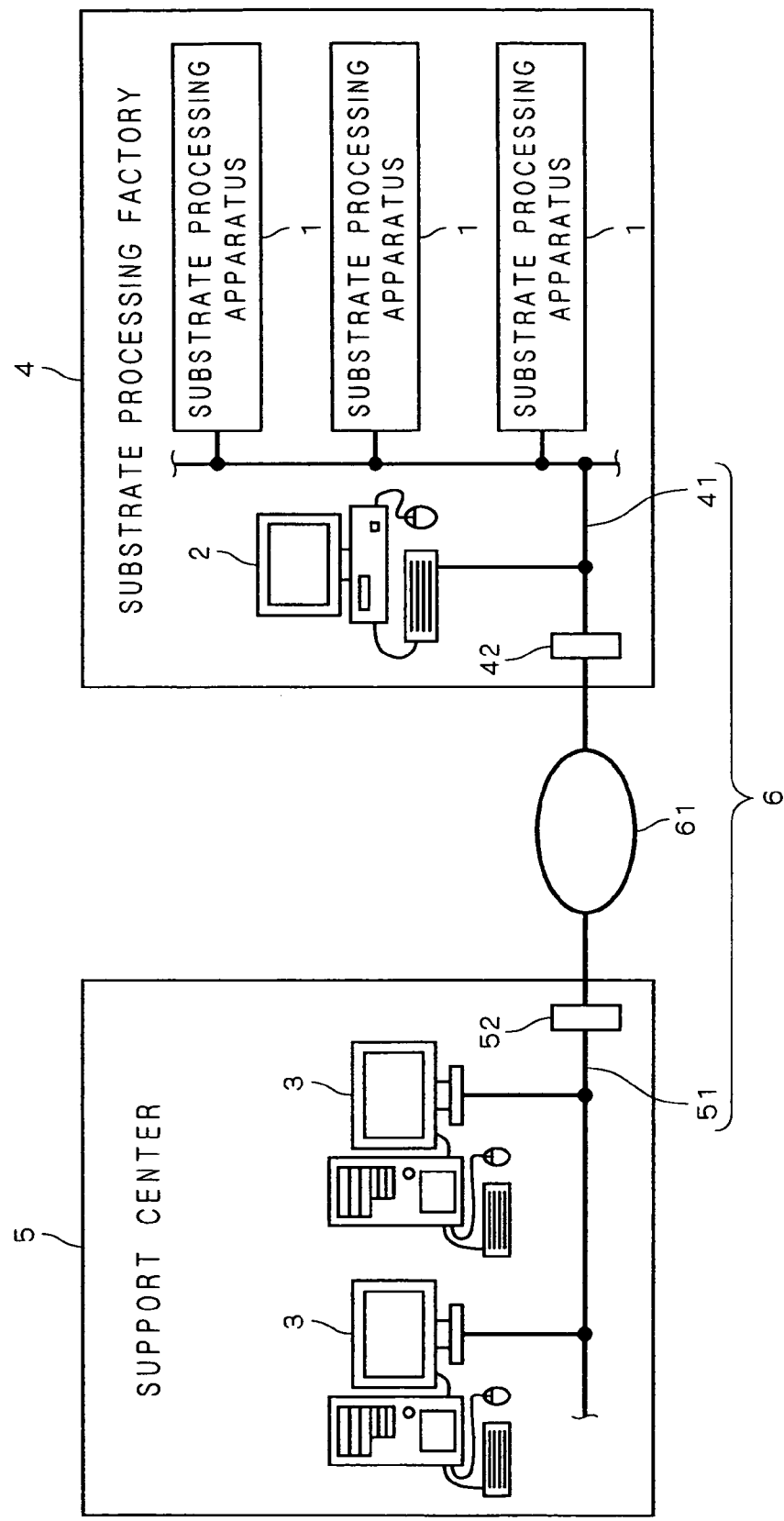
FIG. 1 schematically illustrates the structure of a substrate processing system according to the present invention.

FIG. 1 schematically illustrates the structure of a substrate processing system 10 according to a first embodiment of the present invention. As shown in FIG. 1, the substrate processing system 10 is mainly formed by connecting substrate processing apparatuses 1 and an information storage server 2 provided on a substrate processing factory 4 and support computers 3 provided on a support center 5 having failure analysts analyzing failures of the substrate processing apparatuses 1 with each other through a network 6.

In the substrate processing system 10, the information storage server 2 stores apparatus information including log files and failure information of the substrate processing apparatuses 1, so that the stored apparatus information is readable in the support computers 3 through the network 6.

In the substrate processing factory 4, the substrate processing apparatuses 1 and the information storage server 2 are connected with each other through a LAN (local area network) 41. The LAN 41 is connected to a wide area network 61 such as the Internet through a connector 42 having the functions of a router and a firewall. The support center 5 also has a LAN 51 connected with the support computers 3, and this LAN 51 is also connected to the wide area network 61 through a connector 52 having the functions of a router and a firewall. Thus, the substrate processing apparatuses 1, the information storage server 2 and the support computers 3 can make data communication with each other. Throughout this specification, the LANs 41 and 51 and the wide area network 61 are generically referred to as the network 6.

Referring to FIG. 1, the plurality of substrate processing apparatuses 1 provided on the substrate processing factory 4 may alternatively be replaced with a single substrate processing apparatus 1, and the plurality of support computers 3 provided on the support center 5 may also be replaced with a single support computer 3. While FIG. 1 illustrates only one substrate processing factory 4, the substrate processing system 10 may alternatively include a plurality of substrate processing factories.

Figure 2:
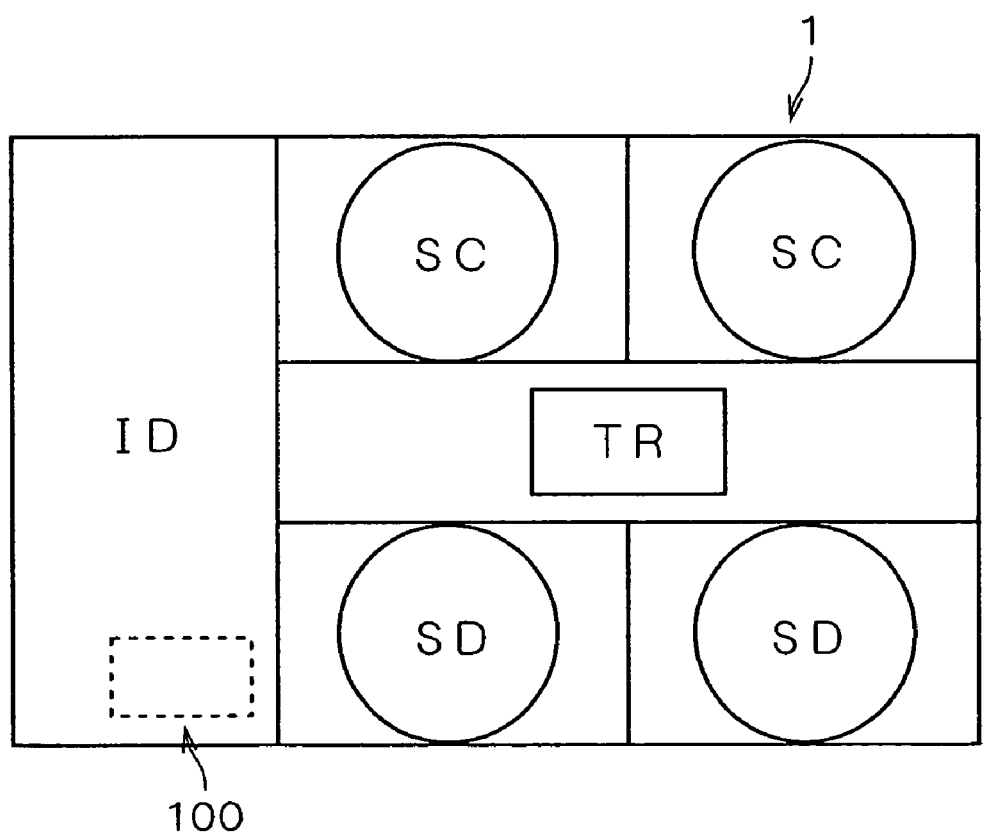
FIG. 2 is a schematic plan view of a substrate processing apparatus.

Each substrate processing apparatus 1 arranged on the substrate processing factory 4 is now described. FIG. 2 is a schematic plan view of the substrate processing apparatus 1. This substrate processing apparatus 1 performs resist coating, development and subsequent heat treatment on substrates. The substrate processing apparatus 1 comprises an indexer ID delivering unprocessed substrates from a carrier while receiving processed substrates and storing the same in the carrier, coating units (the so-called spin coaters) SC dripping photoresist on main surfaces of substrates while rotating the substrates for coating the resist thereto, developing units (the so-called spin developers) SD supplying a developer to exposed substrates thereby developing the same and a transfer robot TR transferring the substrates between the indexer ID and the units SC and SD. Heat treatment units (not shown) are arranged above the coating units SC and the developing units SD through a fan filter unit. A heating unit (the so-called hot plate) for heating the substrates and a cooling unit (the so-called cool plate) for cooling the heated substrates to a constant temperature are provided as the heat treatment units. Throughout the specification, the coating units SC, the developing units SD and the heat treatment units are generically referred to as a processing unit 110 performing prescribed processing on the substrates.

Figure 3:
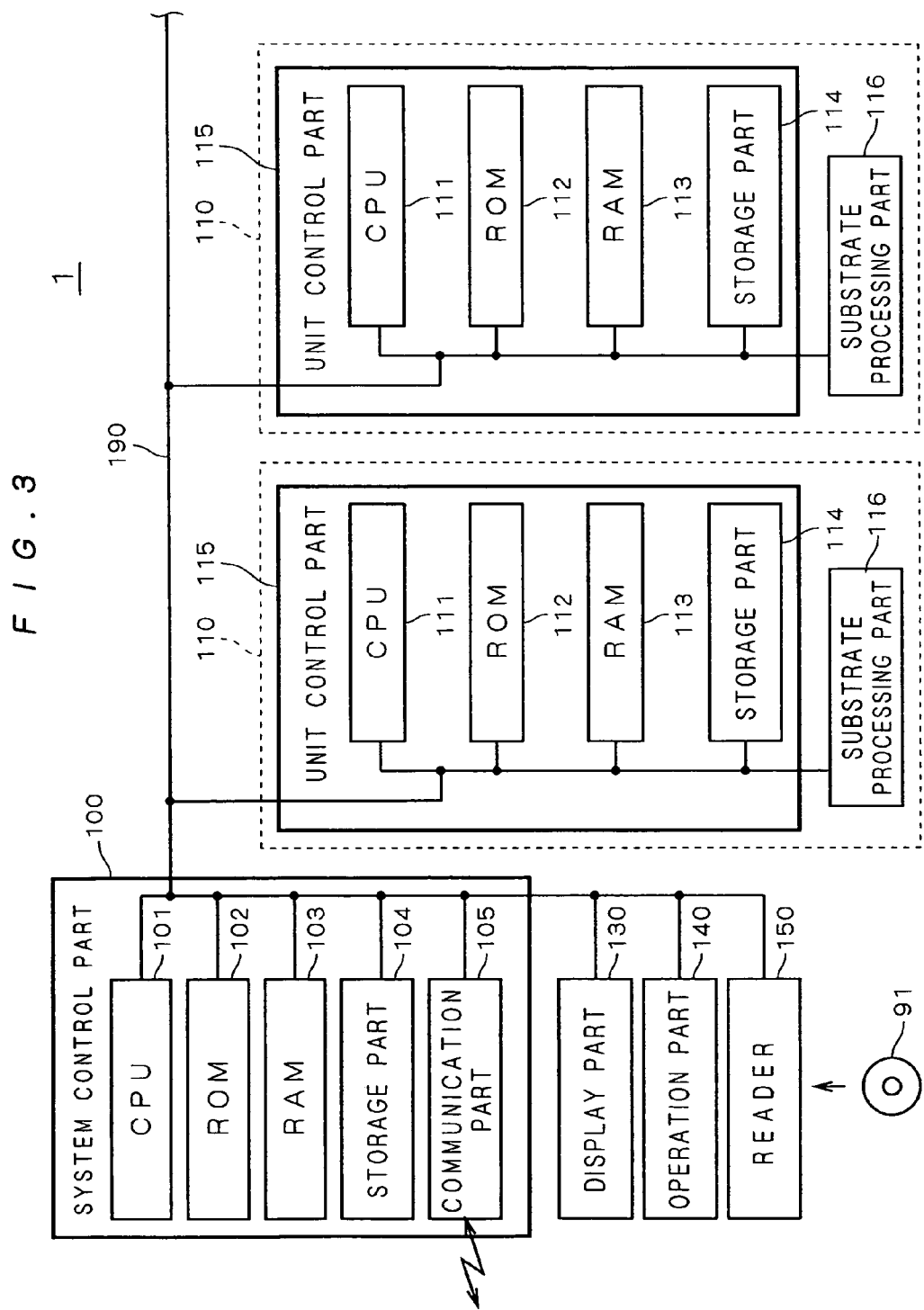
FIG. 3 is a block diagram showing the structure of a control system for the substrate processing apparatus.

FIG. 3 is a block diagram showing the structure of a control system for the substrate processing apparatus 1. As shown in FIG. 3, the substrate processing apparatus 1 mainly comprises a system control part 100 controlling the overall apparatus 1 and a plurality of processing units 110.

The system control part 100 unitedly controlling the overall apparatus 1 comprises a microcomputer. More specifically, the system control part 100 comprises a CPU 101 forming the main frame, a ROM 102 storing control programs etc., a RAM 103 serving as a working area for operation, a storage part 104 consisting of a hard disk or the like storing log files etc. and a communication part 105 making data communication with an external device, which are connected with each other through a bus line 190.

The communication part 105 is connected to the network 6 through a network interface (not shown), so that the substrate processing apparatus 1 can transmit/receive various data to/from the information storage server 2, each support computer 3 etc. While the communication part 105 may make either radio communication or wireless communication through the network 6, this embodiment employs a radio communication system.

In addition to the plurality of processing units 110, a display part 130 displaying various information, an operation part 140 accepting input of information by the operator and operation, a reader 150 reading various data from a recording medium 91 such as a magnetic disk or a magneto-optical disk are also electrically connected to the bus line 190. Thus, data can be transferred between the respective parts of the substrate processing apparatus 1 through the bus line 190 under control of the system control part 100.

The processing unit 110 also comprises unit control parts 115 along with substrate processing parts 116 defining working parts (including mechanisms rotating the substrates, mechanisms discharging a processing solution toward the substrates, mechanisms heating the substrates etc., for example) processing the substrates in practice. Each unit control part 115 controls and monitors operation of each substrate processing part 116. In other words, the aforementioned system control part 100 unitedly controls the overall substrate processing apparatus 1, while each unit control part 115 takes charge of control responsive to the contents of processing in each substrate processing part 116. The unit control part 115 comprises a microcomputer similarly to the system control part 100. More specifically, the unit control part 115 comprises a CPU 111 forming the main frame, a ROM 112 storing control programs etc., a RAM 113 serving as a working area of operation and a storage part 114 consisting of an SRAM or the like backed up with a battery for storing various data.

The ROM 102 and the storage part 104 of the system control part 100 previously store system control programs. When the CPU 101 of the system control part 100 executes arithmetic operation according to any system control program, it follows that the substrate processing apparatus 1 implements operation control or data processing as a whole. The ROM 112 and the storage part 114 of the unit control part 115 previously store unit control programs responsive to the contents of processing of the substrate processing part 116 of the processing unit 110. When the CPU 111 executes arithmetic operation according to any unit control program, it follows that the substrate processing part 116 implements operation control or data processing. Functions implemented by the arithmetic operation of the system control part 100 and the unit control part 115 according to these programs are described later.

These programs can be acquired and updated through reading from the recording medium 91 through the reader 150 or downloading from a prescribed server or the like through the network 6. Each of the programs has a version, and version information as to a numerical value for identifying the version or the like is updated when the program is updated. The storage part 104 of the system control part 100 stores the version information of each program run in the substrate processing apparatus 1.

The information storage server 2 and each support computer 3 are similar in hardware structure to a general computer. Therefore, each of the information storage server 2 and the support computer 3, which are similar in basic structure to each other, is described in common with reference to FIG. 4. As shown in FIG. 4, each of the information storage server 2 and the support computer 3 is formed by connecting a CPU 21 (belonging to the information storage server 2; this also applies to the following description) or 31 (belonging to the support computer 3; this also applies to the following description) executing arithmetic operation, a ROM 22 or 32 storing a basic program and a RAM 23 or 33 storing various information to a bus line. A hard disk 24 or 34 storing various information, a display 25 or 35 displaying various information, a keyboard 26a or 36a and a mouse 26b or 36b accepting input from the operator, a reader 27 or 37 reading various data from the recording medium 91 such as an optical disk, a magnetic disk or a magneto-optical disk and a communication part 28 or 38 making communication with the external device through the network 6 are properly connected to the bus line for each of the information storage server 2 and the support computer 3 through an interface (I/F) or the like.

Each of the information storage server 2 and the support computer 3 can read any program from the recording medium 91 through the reader 27 or 37 and store the same in the hard disk 24 or 34. Each of the information storage server 2 and the support computer 3 can also download data from the prescribed server through the network 6 and store the same in the hard disk 24 or 34. The CPU 21 or 31 executes arithmetic operation according to the program stored in the hard disk 24 or 34, for performing desired operation. In other words, it follows that the information storage server 2 carries out operation as the information storage server 2 and the support computer 3 carries out operation as the support computer 3 as a result of executing arithmetic operation according to the program.

Figure 5:
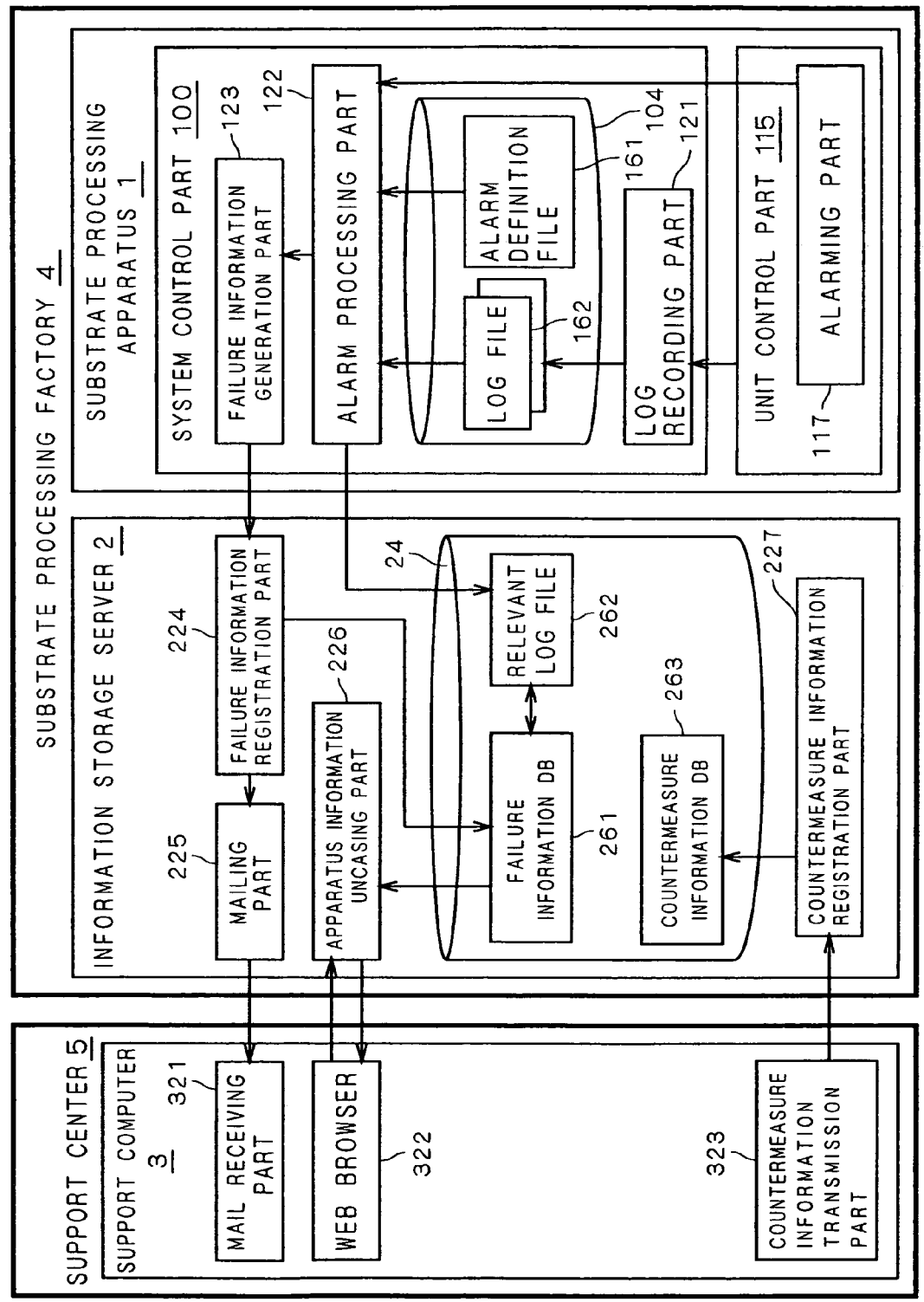
FIG. 5 is a block diagram showing an exemplary functional structure of a substrate processing system according to a first embodiment of the present invention.

FIG. 5 is a block diagram schematically showing the functional structure of the substrate processing system 10 including functions implemented by arithmetic operation of the CPU 21 or 31 according to the program in each of the information storage server 2 and the support computer 3.

In the structure shown in FIG. 5 with reference to the substrate processing apparatus 1, an alarming part 117 is a function implemented by the unit control part 115 performing arithmetic operation according to a program. A log recording part 121, an alarm processing part 122 and a failure information generation part 123 are functions implemented by the system control part 100 performing arithmetic operation according to programs.

The alarming part 117 gives an alarm as a warning signal when some failure takes place in the processing unit 110. Identification codes are previously assigned to various alarms, so that the alarming part 117 gives an alarm having an identification code corresponding to the failure and transmits the same to the system control part 100.

The log recording part 121 records information as to operation of the processing unit 110 in the storage part 104 as log files 162. Every time a predetermined event related to the operation takes place, the log files 162 record the time and the contents of the event. The log files 162 are operation information indicating time-series information as to the operation of the substrate processing apparatus 1, and define one of apparatus information for analyzing the cause of the failure upon occurrence of the failure.

The log files 162 include a plurality of types of logs such as a substrate position log, a process log, an alarm log, an operation log and a communication log, which are classified by the log recording part 121 in response to the event and recorded as individual files respectively. Identification codes are previously assigned to the respective log files 162.

The substrate position log is a log file 162 indicating time-series information of the position of a processed substrate in the substrate processing apparatus 1. More specifically, the substrate position log indicates identification information for the processing unit 110 receiving the substrate, for example. The log recording part 121 records such a substrate position log every time the transport robot TR transports a substrate. Each substrate processed in the substrate processing apparatus 1 is supplied with an ID code and the substrate position log is recorded along with the ID code, so that it is possible to confirm when and which substrate has been transferred to which position post hoc by specifying the substrate.

The process log is a log file 162 indicating time-series information on processing steps such as the contents, conditions etc. of the processing actually performed in each processing unit 110. More specifically, the process log indicates the heating temperature and the heating time in the heating unit, the quantity and the concentration of the resist coated in the coating unit SC etc., for example. It follows that the process log is transmitted to the log recording part 121 from the unit control part 115 of each processing unit 110 and recorded therein every time a substrate is processed. The process log is also recorded along with the ID code of the substrate, so that it is possible to confirm which substrate has been processed when in which processing unit 110 under which processing conditions post hoc by specifying the substrate. When a substrate gets some flaw in the process therefor, the defect of the substrate is generally not detected unless the process progresses to some extent. According to this embodiment, however, it is possible to grasp the flaw on the process seemingly causing the defect post hoc by confirming the process log. When reliably preserving this process log upon occurrence of a failure, the analysis of the cause of the failure is simplified.

The alarm log is a log file 162 indicating time-series information of the given alarm. More specifically, the alarm log indicates the identification information on the processing unit 110 giving the alarm, an identification code of the alarm etc. The log recording part 121 records the alarm log every time the same is given. It is possible to confirm when and which alarm has been given in what processing unit 110 post hoc through the alarm log.

The operation log is a log file 162 indicating time-series information of the contents of operation of the operation part 140 performed by the operator. More specifically, the operation log indicates a start instruction or a processing condition changing instruction for the substrate processing apparatus 1. The log recording part 121 records the operation log every time the operator performs operation. It is possible to confirm when and which operation has been performed post hoc through the operation log.

The communication log is a log file 162 indicating time-series information of communication between the substrate processing apparatus 1 and the external device such as the information storage server 2 through the communication part 105. More specifically, the communication log indicates the contents of information transmitted to the information storage server 2 or the like. The log recording part 121 records the communication log every time the communication part 5 makes communication. It is possible to confirm when and what kind of communication has been made post hoc through the communication log.

The alarm processing part 122 receives the alarm from the alarming part 117 for performing operation control in response to the identification code of this alarm. The alarm processing part 122 performs this prosing by referring to an alarm definition file 161 previously stored in the storage part 104. The alarm definition file 161 is stored as an independent file every category (each coating unit SC, each developing unit SD or the like) of the processing unit 110, so that the alarm processing part 122 selects and refers to the proper alarm definition file 161 in response to the processing unit 110 giving the alarm.

FIG. 6 illustrates an exemplary alarm definition file 161. As shown in FIG. 6, the alarm definition file 161 is a table having a plurality of fields including "alarm code", "display text", "system control code", "output log file code" etc.

The "alarm code" is a field indicating the identification code included in the given alarm. The remaining fields ("display text", "system control code", "output log file code" etc.) are associated with this "alarm code". It follows that the alarm processing part 122 retrieves the identification code of the received alarm from the "alarm code" and performs processing according to the contents described in the remaining codes corresponding to this identification code.

The "display text" is a field indicating the specific contents of the failure as a text. The alarm processing part 122 makes the display part 130 display the contents indicated in this "display text". Thus, the operator can grasp what kind of failure has been caused as a specific text.

The "system control code" is a field indicating the contents of control of the substrate processing apparatus 1 at the time of occurrence of the alarm. More specifically, control contents are previously assigned to the "system control code" so that the operation of the substrate processing apparatus 1 is stopped if the "system control code" is "1" and the substrate processing apparatus 1 is forcibly restarted if the "system control code" is "2". The alarm processing part 122 performs operation control according to the contents described in the "system control code", and hence it follows that the substrate processing apparatus 1 performs proper operation in response to the type of the failure.

The "output log file code" is a field indicating the identification codes of the log files 162 relevant to the cause of the alarm. In other words, the output log file code selectively describes only the identification codes of the log files 162 necessary for grasping the cause of the failure. Thus, the alarm processing part 122 can readily select and extract only the log files 162 (e.g., only the process log and the operation log) relevant to the cause of the alarm. The log files 162, relevant to the cause of the alarm, extracted by the alarm processing part 122 are hereinafter also referred to as relevant log files 262.

The alarm processing part 122 transmits the relevant log files 262 to the information storage server 2 through the LAN 41. The hard disk 24 of the information storage server 2 stores the transmitted relevant log files 262. The alarm processing part 122 instructs the failure information generation part 123 to generate failure information.

The failure information generation part 123 receiving the instruction from the alarm processing part 122 generates failure information as to the occurring failure. In other words, the failure information generation part 123 serves as means generating failure information when the alarm is given.

The failure information, one of the apparatus information for specifying the cause of the failure along with the relevant log files 262, comprises items such as "date", "apparatus", "unit", "version", "contents of failure" and "log".

The "date" indicating the date of alarming is acquired from a prescribed timer circuit in generation of the failure information.

The "apparatus" is identification information of the faulty substrate processing apparatus 1 itself. The identification information, previously assigned to each of the substrate processing apparatuses 1 arranged on the substrate processing factory 4, is stored in the storage part 104.

The "unit" is identification information of the faulty processing unit 110. This indicates the processing unit 110 transmitting the alarm.

The "version" is version information of a unit control program in the faulty processing unit 110. The failure may occur only in a specific version of the program, and hence it may be possible to specify the cause of the failure through the version information.

The "contents of failure", indicating the contents of the "display text" of the aforementioned alarm definition file 161, are acquired from the alarm processing part 122.

The "log", which is a retention path of each relevant log file 262 in the information storage server 2, is acquired from the alarm processing part 122. It follows that the failure information and each relevant log file 262 are associated with each other through this item.

Thus, the failure information is formed by information enabling the operator or the failure analyst to specifically and readily grasp the contents of the occurring failure. The failure information generation part 123 transmits the generated failure information to the information storage server 2 through the LAN 41.

The information storage server 2 stores the apparatus information of each substrate processing apparatus 1 arranged on the substrate processing factory 4. In the structure shown in FIG. 5, a failure information registration part 224, a mailing part 225, an apparatus information uncasing part 226 and a countermeasure information registration part 227 are functions implemented by the CPU 21 performing arithmetic operation according to programs.

When receiving the failure information from the failure information generation part 123 of the substrate processing apparatus 1, the failure information registration part 224 additionally registers the same in a failure information database (hereinafter referred to as "failure information DB") 261. Therefore, it follows that the hard disk 24 stores the failure information as the failure information DB 261. In the additional registration of the failure information, the failure information registration part 224 automatically generates an identification number of the added failure information.

FIG. 7 illustrates an exemplary failure information DB 261. As shown in FIG. 7, the failure information DB 261 has a plurality of fields D1 to D6 storing the items "date", "apparatus", "unit", "version", "contents of failure" and "log" of the failure information respectively. A field D0 stating "No." stores the identification number of each generated failure information. The field D6 stating "log" stores the retention paths of the relevant log files 262, and hence the failure information DB 261 is also associated with the relevant log files 262. Failure information is stored as the failure information DB 261 every time a failure takes place, and hence it follows that the failure information DB 261 also shows the history of failures occurring in the past in the substrate processing factory 4 along with the information of the present failure.

The failure information registration part 224 instructs the mailing part 225 to post the occurrence of the failure in the substrate processing apparatus 1 to the support computer 3 when additionally registering new failure information in the failure information DB 261.

The mailing part 225 receiving the instruction from the failure information registration part 224 submits e-mail describing the occurrence of the failure to the support computer 3. In other words, the mailing part 225 serves as means posting the occurrence of the failure to the support computer 3 through the network 6 when the alarm is given.

The apparatus information uncasing or formatting or converting part 226 renders the apparatus information such as the failure information DB 261 and the relevant log files 262 stored in the hard disk 24 readable from the support computer 3. The apparatus information uncasing part 226 having an HTTP server function converts the apparatus information to an HTML document and transmits the same to the network 6. The apparatus information uncasing part 226 transmits the apparatus information in response to a request for reading received from the external device connected to the network 6 through a WEB browser.

The countermeasure information registration part 227 receives countermeasure information from the support computer 3. The countermeasure information includes results of analysis made by the failure analyst of the support center 5 reading the apparatus information of the faulty substrate processing apparatus 1 and a countermeasure against the failure etc. In other words, the countermeasure information registration part 227 serves as means acquiring failure countermeasure information based on the apparatus information. When receiving this countermeasure information, the countermeasure information registration part 227 additionally registers the same in a countermeasure information database (hereinafter referred to as "countermeasure information DB") 263. Therefore, it follows that the hard disk 24 stores the countermeasure information as the countermeasure information DB 263.

When the information storage server 2 performs prescribed operation, it is possible to display and confirm the contents of the aforementioned failure information DB 261, the aforementioned relevant log files 262 and the aforementioned countermeasure information DB 263 stored in the hard disk 24 on the display 25 at any time.

In the structure of the support computer 3 shown in FIG. 5, a mail receiving part 321, a WEB browser 322 and a countermeasure information transmission part 323 are functions implemented by the CPU 31 performing arithmetic operation according to programs.

The mail receiving part 321 receives e-mails through the network 6. The mail receiving part 321 makes communication with a prescribed mail server (not shown) every constant time, to automatically check e-mails directed to the support computer 3. It follows that the mail receiving part 321 receives the aforementioned e-mail submitted from the mailing part 225.

The WEB browser 322 has a function of, when an address (URL) on the network 6 is specified, acquiring an HTML document or the like present on this address. When a prescribed address is specified, the apparatus information stored in the information storage server 2 can be acquired through the apparatus information uncasing part 226. Thus, the failure analyst of the support center 5 can read the failure information, the relevant log files 262 etc. of the faulty substrate processing apparatus 1.

The countermeasure information transmission part 323 transmits the countermeasure information to the information storage server 2. The failure analyst inputs the countermeasure information in the support computer 3 through prescribed operation, so that the countermeasure information transmission part 323 transmits the same to the information storage server 2.

Figure 8:
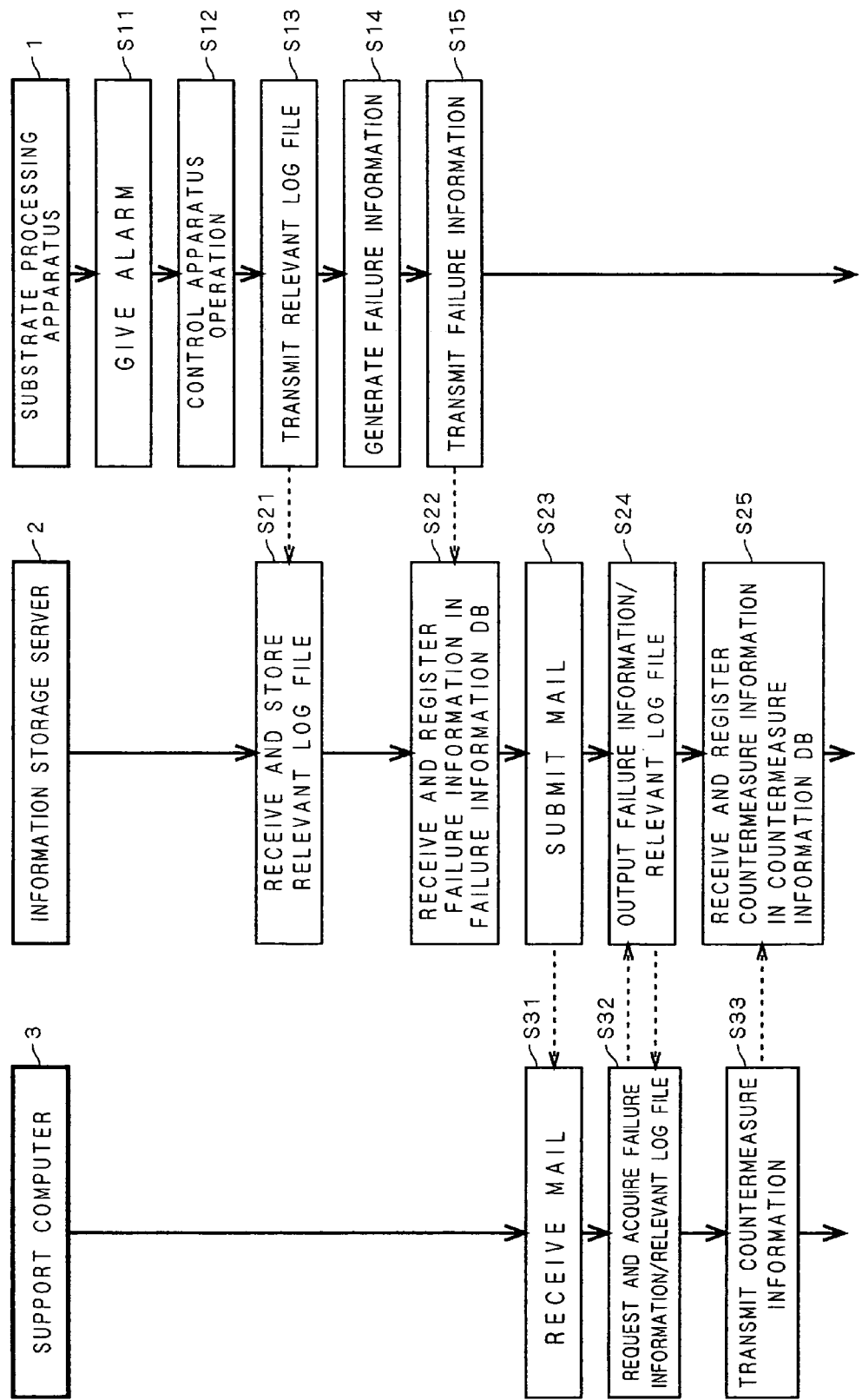
FIG. 8 illustrates the flow of processing in the substrate processing system upon occurrence of a failure.

The contents of processing in the substrate processing system 10 in relation to the faulty substrate processing apparatus 1 are now described. FIG. 8 shows the flow of the processing of the substrate processing system 10. Referring to FIG. 8, the right side shows processing in the substrate processing apparatus 1, the center shows processing in the information storage server 2 and the left side shows processing in the support computer 3 respectively. The time elapses in descending order.

When a failure occurs in any processing unit 110 of the substrate processing apparatus 1, the alarming part 117 of this processing unit 110 gives an alarm having an identification code corresponding to the failure and transmits the same to the system control part 100 (step S11).

The alarm processing part 122 receives the transmitted alarm and performs operation control responsive to the identification code. In other words, the alarm processing part 122 refers to the alarm definition file 161 and makes the display part 130 display specific contents of the failure described in the "display text", while stopping operation of the substrate processing apparatus 1 according to the "system control code" (step S12).

The alarm processing part 122 further refers to the "output log file code" of the alarm definition file 161, extracts the relevant log files 262 and transmits the same to the information storage server 2 (step S13). The hard disk 24 stores the relevant log files 262 received in the information storage server 2 (step S21). Thus, it follows that only the relevant log files 262 necessary for analyzing the failure are extracted and reliably preserved. The process log, which is particularly important for analyzing the cause of the failure as hereinabove described, is preferably reliably preserved as one of the relevant log files 262.

Then, the alarm processing part 122 instructs the failure information generation part 123 to generate failure information while transferring the contents of the "display text" of the alarm definition file 161 and the retention paths of the relevant log files 262. The failure information generation part 123 instructed by the alarm processing part 122 generates failure information (step S14) and transmits the generated failure information to the information storage server 2 (step S15).

The failure information registration part 224 of the information storage server 2 receives the failure information and additionally registers the same in the failure information DB 261 (step S22). Thus, the hard disk 24 stores the failure information as to the occurring failure and the relevant log files 262 in association with each other, so that the same are readable from the support computer 3 through the apparatus information uncasing part 226. Proper security such as a password is preferably employed for the failure information DB 261 and the relevant log files 262 to be prevented from illegal reading when transmitted to the network 6.

The failure information registration part 224 instructs the mailing part 225 to post the occurrence of the failure in the substrate processing apparatus 1 to the support computer 3. The mailing part 225 receiving this instruction submits e-mail describing the occurrence of the failure to the mail address of the support computer 3 (step S23). The hard disk 24 previously stores this mail address.

The mail receiving part 321 of the support computer 3 receives the submitted e-mail (step S31). Thus, the failure analyst of the support center 5 recognizes the occurrence of the failure in the substrate processing factory 4. The aforementioned processing for submitting the e-mail following occurrence of the failure is entirely automatically carried out and hence the failure analyst can immediately recognize the occurrence of the failure regardless of the time zone in spite of the remote place.

The failure analyst receiving the e-mail requests the information storage server 2 to allow reading of the failure information DB 261 through the WEB browser 322. An address specified to the WEB browser 322 at this time may be either described in the aforementioned e-mail or previously stored in the hard disk 34 of the support computer 3 or the like. The apparatus information uncasing part 226 of the information storage server 2 receiving this request transmits the failure information DB 261 to the support computer 3. Thus, the display 35 of the support computer 3 displays the contents of the failure information DB 261 as shown in FIG. 7.

The failure analyst can specifically and readily grasp the contents of the failure through the failure information defining the final data of the failure information DB 261. The failure analyst can further display and read the relevant log files 262 for the failure by specifying the field D6 describing "log" through prescribed operation (steps S32 and S24). Only the relevant log files 262 relevant to the failure have already been extracted and hence the volume of the data is so limited that the data can be received at a relatively high speed.

The failure analyst analyzes the cause of the failure on the basis of the failure information and the relevant log files 262. Also in this analysis, the cause of the failure can be readily and properly estimated since only the relevant log files 262 relevant to the failure have been extracted. Further, the failure analyst can also estimate the cause of the failure from past failure information since the history of failures occurring in the past can also be read.

When completely analyzing the cause of the failure, the failure analyst inputs the results of analysis of the failure and the countermeasure therefor in the support computer 3 as the countermeasure information.

The countermeasure information comprises information of items "No.", "object apparatus", "unit", "analytic result", "countermeasure", "program schedule", "version" etc.

The item "No." indicates the identification number of the countermeasure information, which is identical to the identification number of the failure information.

The item "object apparatus" indicates the identification information of the faulty substrate processing apparatus 1, which is identical to the item "apparatus" in the failure information.

The item "unit" indicates the identification information of the faulty processing unit 110, which is identical to the item "unit" in the failure information.

The item "analytic result" indicates the results analyzed on the basis of the failure information and the relevant log files 262, specifically describing the cause of the failure etc.

The item "countermeasure" indicates a specific countermeasure against the failure, describing an operation procedure of action against the failure etc.

The item "program schedule" indicates a planned release date of a new problem for the substrate processing apparatus 1 for avoiding occurrence of failures. The substrate processing apparatus 1 can be prevented from the same failure due to an update to this new program.

The item "version" indicates version information of the aforementioned new program.

The countermeasure information transmission part 323 transmits the input information to the information storage server 2 (step S33). The countermeasure information registration part 227 of the information storage server 2 receives the countermeasure information and additionally registers the same in the countermeasure information DB 263 (step S25).

FIG. 9 illustrates an exemplary countermeasure information DB 263. As shown in FIG. 9, the countermeasure information DB 263 has a plurality of fields D10 to D16 storing information of the items "No.", "object apparatus", "unit", "analytic result", "countermeasure", "program schedule" and "version" of the countermeasure information respectively. The contents of the countermeasure information DB 263 can be read in the information storage server 2 at any time, and hence it follows that the operator of the substrate processing factory 4 can also properly deal with the failure.

Thus, it is possible to automatically post the failure occurring in the substrate processing apparatus 1 to the failure analyst of the support center 5 so that he/she can immediately refer to the failure information and the relevant log files 262 from the remote place through the network 6, whereby the time required for starting analyzing the cause of the failure after recognizing the occurrence of the failure can be remarkably reduced.

Only the relevant log files 262 relevant to the failure are extracted and stored, whereby the log files 262 necessary for analyzing the cause of the failure can be reliably stored and preserved. Further, the volume of the stored data is limited, whereby the data can be transmitted to the support computer 3 at a relatively high speed, and the time for retrieving recorded contents necessary for the analysis can also be reduced.

In addition, the time for the analysis is reduced while the analytic result and the countermeasure information can be confirmed at any time, whereby a proper countermeasure can be immediately taken against the failure.

The first embodiment is not restricted to the above. For example, while the information storage server 2 is arranged in the substrate processing factory 4, the present invention is not restricted to this but the information storage server 2 may alternatively be arranged at any place so far as the same is connected to the network 6 to be capable of making communication with each substrate processing apparatus 1 and each support computer 3.

Figure 10:
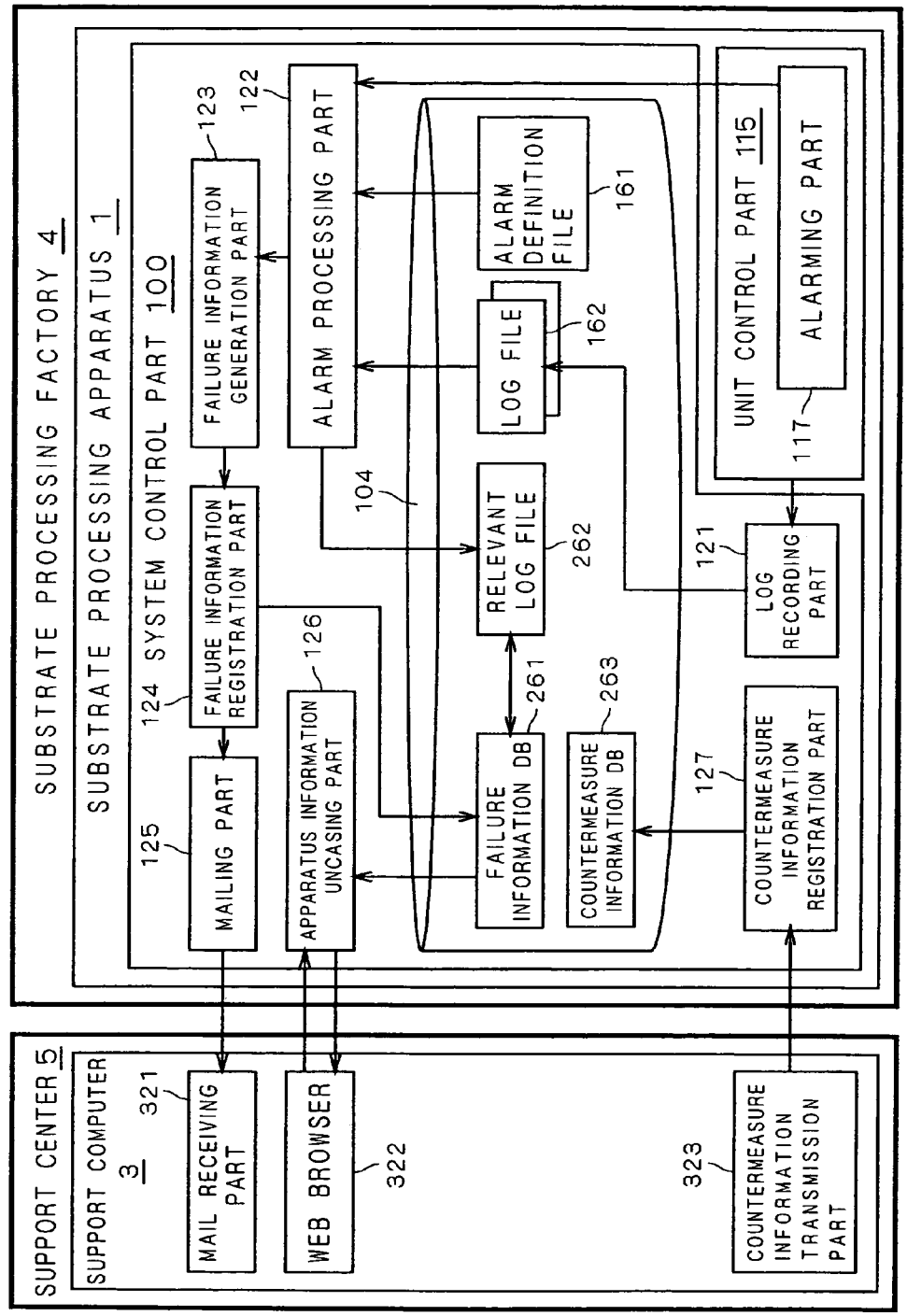
FIG. 10 is a block diagram showing another exemplary functional structure of the substrate processing system according to the first embodiment.

The substrate processing apparatus 1 may alternatively have the processing function of the information storage server 2. FIG. 10 schematically shows another functional structure of the substrate processing system 10 provided with a substrate processing apparatus 1 having the processing function of the information storage server 2. Elements having the same functions as those in FIG. 5 are denoted by the same reference numerals.

In the structure shown in FIG. 10, a failure information registration part 124, a mailing part 125, an apparatus information uncasing part 126 and a countermeasure information registration part 127 are functions implemented by a system control part 100 of the substrate processing apparatus 1 performing arithmetic operation according to programs.

The failure information registration part 124 corresponds to the function of the failure information registration part 224 of the information storage server 2, the mailing part 125 corresponds to the function of the mailing part 225 of the information storage server 2, the apparatus information uncasing part 126 corresponds to the function of the apparatus information uncasing part 226 of the information storage server 2, and the countermeasure information registration part 127 corresponds to the function of the countermeasure information registration part 227 of the information storage server 2.

According to this structure, the substrate processing apparatus 1 can take charge of the processing carried out in the information storage server 2 in the aforementioned embodiment, and the present invention can be implemented with a simpler structure.

While the items "display text", "system control code", and "output log file code" are associated with the "alarm code" defining the warning signal in the alarm definition file 161 in the aforementioned embodiment, the "alarm code" may be associated with any other items so far as at least the warning signal and relevant operation information relevant to the cause of the warning signal are associated with each other.

While the information storage server 2 stores only the relevant log files 262 and the failure information as the apparatus information so that the same can be read from the support computer 3 in the aforementioned embodiment, any information is employable so far as the same is apparatus information related to the substrate processing apparatus 1.

2. Second Embodiment

The schematic structure of a substrate processing system 10 according to a second embodiment of the present invent is identical to that shown in FIG. 1. In the substrate processing system 10 according to the second embodiment, however, a support computer 3 stores additional information such as countermeasure information against a failure of a substrate processing apparatus 1, so that the substrate processing apparatus 1 can acquire the stored additional information through a network 6.

The substrate processing apparatus I is identical in structure to that of the first embodiment described with reference to FIGS. 2 and 3. The support computer 3 is a computer storing the additional information and providing the additional information in response to a request from the substrate processing apparatus 1, and the structure thereof is identical to that of the first embodiment described with reference to FIG. 4.

Figure 11:
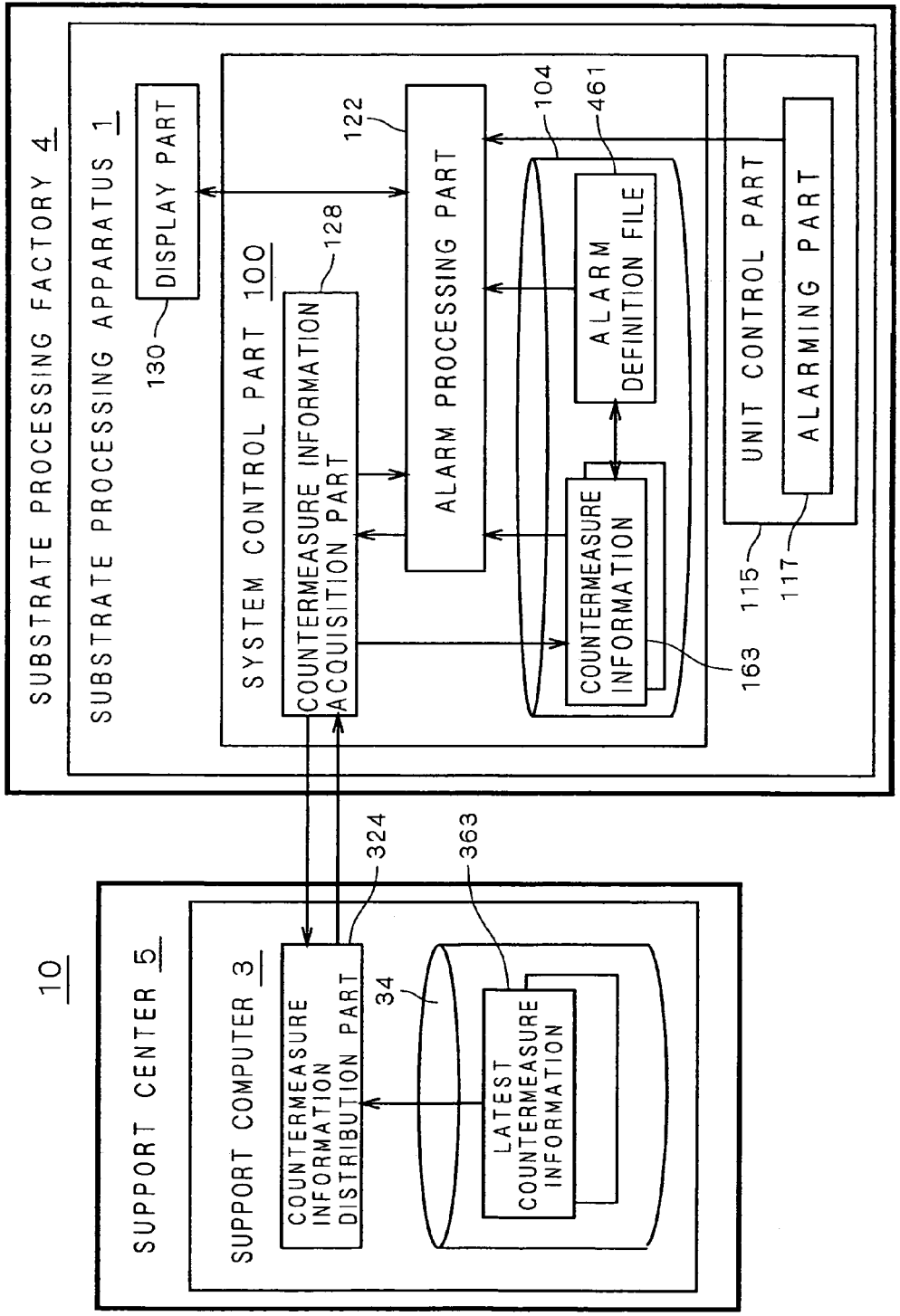
FIG. 11 is a block diagram showing an exemplary functional structure of a substrate processing system according to a second embodiment of the present invention.

FIG. 11 is a block diagram schematically showing the functional structure of the substrate processing system 10 including functions implemented by the substrate processing apparatus 1 and the support computer 3 according to the second embodiment through arithmetic operation of CPUs or the like according to programs respectively.

As shown in FIG. 11, a storage part 104 of the substrate processing apparatus 1 previously stores countermeasure information 163 against any failure assumed in the substrate processing apparatus 1. The countermeasure information 163 describes the cause of the failure, a countermeasure against the failure, constraints on functions following the failure etc.

The countermeasure information 163 is prepared for each of the types of assumed failures and stored as an individual file. This countermeasure information 163 is selected at need upon occurrence of a failure, so that a display part 130 displays the contents thereof. The countermeasure information 163 previously stored in the substrate processing apparatus 1 is hereinafter also referred to as "in-apparatus countermeasure information" 163.

A hard disk 34 of the support computer 3 also stores additional information such as countermeasure information 363 against any failure of the substrate processing apparatus 1. The contents of the countermeasure information 363 are updated every time a system supervisor of a support center 5 finds out new countermeasure information. Therefore, it follows that the countermeasure information 363, also including information found out and added after introduction of the substrate processing apparatus 1, is regularly stored as the latest countermeasure information. The countermeasure information 363 stored in the support computer 3 is hereinafter also referred to as "latest countermeasure information" 363.

The substrate processing apparatus 1 can acquire the latest countermeasure information 363 from the support computer 3 through the network 6 for updating the contents of the in-apparatus countermeasure information 163, while the details are described later.

In the structure shown in FIG. 11, an alarming part 117 is a function implemented by a unit control part 115 of the substrate processing apparatus 1 performing arithmetic operation according to a program. An alarm processing part 122 and a countermeasure information acquisition part 128 are functions implemented by a system control part 100 of the substrate processing apparatus 1 performing arithmetic operation according to programs. A countermeasure information distribution part 324 is a function implemented by a CPU 31 of the support computer 3 performing arithmetic operation according to a program.

When some failure occurs in any processing unit 110, the alarming part 117 gives an alarm as a warning signal indicating the occurrence of the failure. Identification codes are previously assigned to alarms so that the alarming part 117 gives an alarm having an identification code corresponding to the occurring failure and transmits the same to the system control part 100.

The alarm processing part 122 receives the alarm from the alarming part 117 and performs operation control in response to the identification code of the alarm. The alarm processing part 122 performs this processing by referring to an alarm definition file 461 previously stored in the storage part 104. The alarm definition file 461 is stored as an independent file every category (each coating unit SC, each developing unit SD or the like) of the processing unit 110, so that the alarm processing part 122 selects and refers to the proper alarm definition file 461 in response to the processing unit 110 giving the alarm.

FIG. 12 illustrates an exemplary alarm definition file 461. As shown in FIG. 12, the alarm definition file 461 is a table having a plurality of fields including items such as "alarm code", "display text", "system control code", "countermeasure information", "date of updating" etc.

The "alarm code" is a field indicating the identification code included in the given alarm. The remaining fields ("display text", "system control code", "countermeasure information", "date of updating" etc.) are associated with this "alarm code". It follows that the alarm processing part 122 retrieves the identification code of the received alarm from the "alarm code" and performs processing according to the contents described in the remaining fields corresponding to this identification code.

The "display text" is a field indicating the contents of the failure as a text. The alarm processing part 122 makes the display part 130 display the contents indicated in this "display text". Thus, the operator can grasp what kind of failure has been caused as a specific text.

The "system control code" is a field indicating the contents of control of the substrate processing apparatus 1 at the time of alarming. More specifically, control contents are previously assigned to the "system control code" so that the operation of the substrate processing apparatus 1 is stopped if the "system control code" is "1" and the substrate processing apparatus 1 is forcibly restarted if the "system control code" is "2". The alarm processing part 122 performs operation control according to the contents described in the "system control code", whereby it follows that the substrate processing apparatus 1 performs proper operation in response to the type of the failure.

The "countermeasure information" is a field indicating the file name of the in-apparatus countermeasure information 163 corresponding to the failure. In other words, the "alarm code" is associated with in-apparatus countermeasure information 163 corresponding to the failure resulting in the alarm. When the failure takes place, therefore, the alarm processing part 122 can readily select the in-apparatus countermeasure information 163 corresponding thereto. The alarm processing part 122 automatically displays the selected in-apparatus countermeasure information 163 on the display part 130 along with the aforementioned "display text".

The "date of updating" is a field indicating the date of updating the in-apparatus countermeasure information 163 shown in the "countermeasure information". In other words, it follows that the "date of updating" indicates that the in-apparatus countermeasure information 163 described on the "countermeasure information" has been the latest information at the point of time of the date shown in the "date of updating". As to a file previously stored from the time of introduction of the substrate processing apparatus 1 and not updated at all, the dates of shipment or introduction of the substrate processing apparatus 1 may be either described or not described.

The countermeasure information acquisition part 128 acquires the latest countermeasure information 363 from the support computer 3 through the network 6. In order to acquire the latest countermeasure information 363, the countermeasure information acquisition part 128 transmits a prescribed request command to the support computer 3. The countermeasure information distribution part 324 of the support computer 3 receives the request command transmitted from the countermeasure information acquisition part 128. The countermeasure information distribution part 324 selects the latest countermeasure information 363 on the basis of the received request command and transmits the same to the substrate processing apparatus 1.

Thus, the countermeasure information acquisition part 128 can acquire the latest countermeasure information 363. The countermeasure information acquisition part 128 overwrites the corresponding file of the in-apparatus countermeasure information 163 with the acquired latest countermeasure information 363. Thus, it follows that the contents of the in-apparatus countermeasure information 163 are updated to the latest information.

Figure 13:
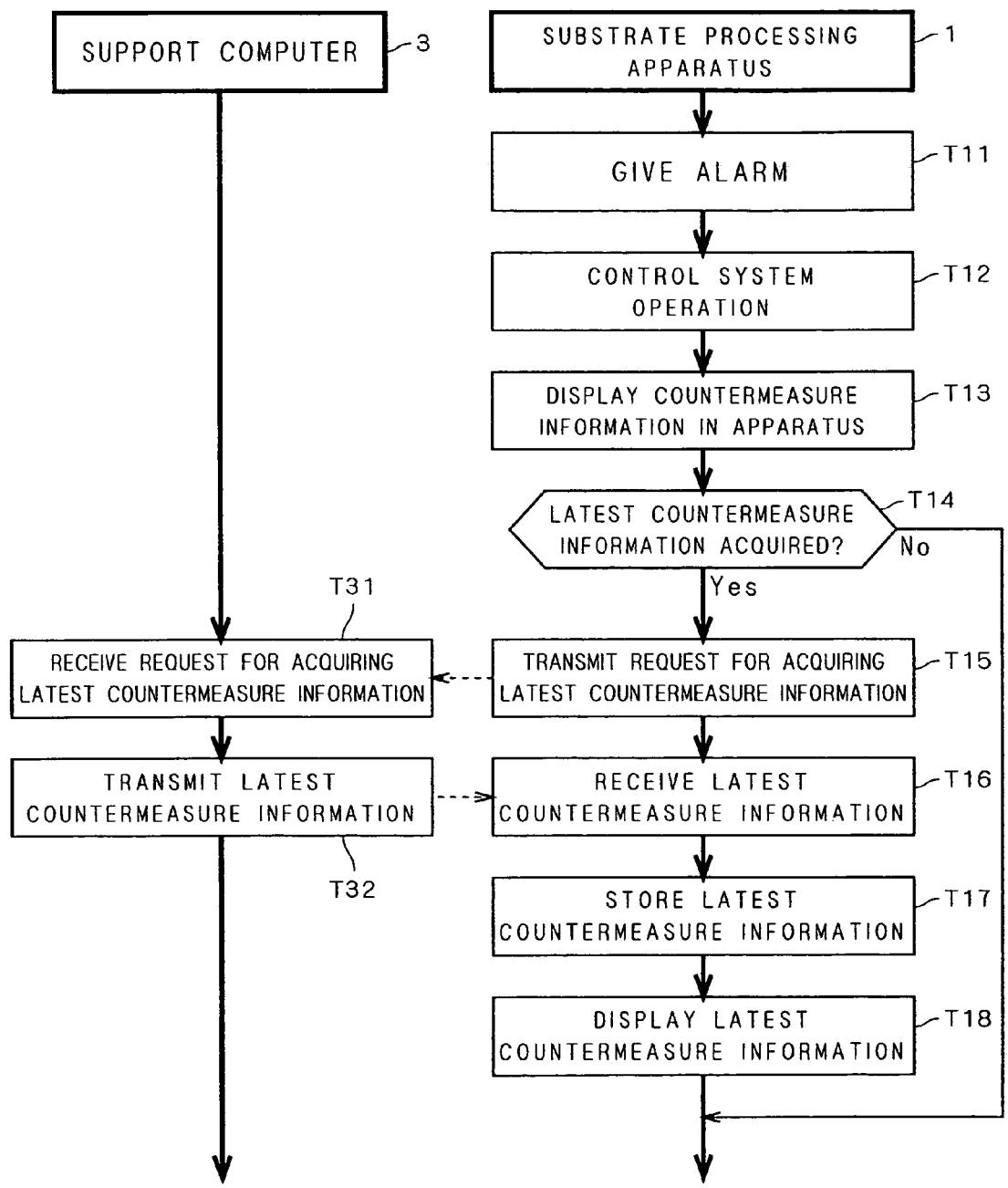
FIG. 13 illustrates the flow of processing in the substrate processing system according to the second embodiment.

The contents of processing in the substrate processing system 10 in relation to the faulty substrate processing apparatus 1 are now described. FIG. 13 shows the flow of the processing of the substrate processing system 10 according to the second embodiment. Referring to FIG. 13, the right side shows processing in the substrate processing apparatus 1, and the left side shows processing in the support computer 3 respectively. The time elapses in descending order.

When a failure occurs in any processing unit 110 of the substrate processing apparatus 1, the alarming part 117 of this processing unit 110 gives an alarm having an identification code corresponding to the failure and transmits the same to the system control part 100 (step T11).

The alarm processing part 122 receives the transmitted alarm, for performing operation control responsive to the identification code. In other words, the alarm processing part 122 refers to the alarm definition file 461 and performs operation control such as stoppage of operation of the substrate processing apparatus 1 according to the "system control code" (step T12).

Then, the alarm processing part 122 refers to the "countermeasure information" of the alarm definition file 461 and selects the in-apparatus countermeasure information 163 corresponding to the failure. The alarm processing part 122 displays the contents of the selected in-apparatus countermeasure information 163 on the display part 130 along with the "display text" of the alarm definition file 461 (step T13). Thus, the operator of the substrate processing apparatus 1 can grasp the specific contents of the failure and a specific countermeasure against the failure.

The display part 130 also displays the contents of the "date of updating" of the alarm definition file 461. Thus, the operator can grasp the date of updating of the in-apparatus countermeasure information 163 having the displayed contents, for judging reliability of the contents. In other words, the operator can judge that there is a possibility that the support computer 3 stores new countermeasure information if a time has elapsed from the date of updating.

The display part 130 further displays a message for inquiring whether or not to acquire the latest countermeasure information (step T14). The operator can input whether or not to acquire the latest countermeasure information through an operation part 140 after confirming the contents of the in-apparatus countermeasure information 163 and the date of updating displayed on the display part 130. When the operator selects no acquisition at this time (NO at the step T14), the following processing of acquiring the latest countermeasure information 363 is not performed but it follows that the operator deals with the failure only through the in-apparatus countermeasure information 163.

When the operator selects acquisition of the latest countermeasure information (YES at the step T14), on the other hand, the alarm processing part 122 instructs the countermeasure information acquisition part 128 to acquire the latest countermeasure information 363. According to this instruction by the alarm processing part 122, the countermeasure information acquisition part 128 transmits a prescribed request command to the support computer 3 in order to acquire the latest countermeasure information 363 (step T15). The countermeasure information distribution part 324 of the support computer 3 receives this request command (step T31).

Identification information of the substrate processing apparatus 1 itself, identification information of the faulty processing unit 110, version information of programs stored in the substrate processing apparatus 1 and the identification code of the alarm are added to the request command. The version information of the programs preferably includes version information of both of a system control program and a unit control program. The countermeasure information acquisition part 128 adds the aforementioned information to the request command.

The countermeasure information distribution part 324 can select the latest countermeasure information 363 to be transmitted in response to the information added to the request command. The countermeasure information distribution part 324 transmits the selected latest countermeasure information 363 to the substrate processing apparatus 1 (step T32), and the countermeasure information acquisition part 128 receives the same (step T16). According to this processing, the countermeasure information acquisition part 128 can selectively acquire only the latest countermeasure information 363 against the failure resulting in the alarm. At the same time, it follows that the volume of the data of the received latest countermeasure information 363 is limited so that the data can be received at a relatively high speed.

The countermeasure information acquisition part 128 overwrites the old in-apparatus countermeasure information 163 (that selected at the step T13) with the received latest countermeasure information 363 and makes the storage part 104 store the same. The countermeasure information acquisition part 128 also rewrites the "date of updating" of the alarm definition file 461 with the date of acquisition of the latest countermeasure information 363. The countermeasure information acquisition part 128 further rewrites the "countermeasure information" of the alarm definition file 461 with the file name of the acquired latest countermeasure information 363 for updating the same. Thus, it follows that the acquired latest countermeasure information 363 is newly associated with the alarm and stored as the in-apparatus countermeasure information 163 (step T17). In other words, the storage part 104 stores the latest countermeasure information 363 similarly to the countermeasure information previously existing from the time of introduction, and the alarm definition file 461 is updated in response thereto. Therefore, the added countermeasure information can also be managed as the countermeasure information against the failure in a unified manner, and treated similarly to the old countermeasure information.

Then, the countermeasure information acquisition part 128 posts the acquisition of the latest countermeasure information 363 to the alarm processing part 122, which in turn refers to the alarm definition file 461 again and makes the display part 130 display the acquired latest countermeasure information 363 (step T18). Thus, the operator can read the latest countermeasure information, for taking a proper countermeasure against the failure.

Thus, the latest countermeasure information 363 can be immediately acquired from the support computer 3 storing the additional information through the network 6, whereby a proper countermeasure can be taken also when a failure occurs in the substrate processing apparatus 1. Further, the additional information is managed along with the previously stored countermeasure information in a unified manner, so that the same can be similarly treated.

The second embodiment is not restricted to the above. For example, while the latest countermeasure information 363 is acquired only when the operator inquired as to whether or not to acquire the latest countermeasure information selects acquisition in the second embodiment, the latest countermeasure information 363 may alternatively be automatically acquired without inquiring the operator. In other words, the processing at the steps T13 and T14 shown in FIG. 13 may not be carried out. Thus, the latest countermeasure information 363 is automatically acquired when a failure occurs in the substrate processing apparatus 1, so that the latest countermeasure information can be regularly read.

While each countermeasure information 163 is stored as an individual file and indirectly associated with the warning signal (alarm) by the alarm definition file 461 in the aforementioned embodiment, the contents thereof may alternatively be described in the "countermeasure information" field of the alarm definition file 461 or the like to be directly associated with the warning signal. In other words, the warning signal and the countermeasure information against the failure resulting in this warning signal may be associated with each other.

While the identification information of the substrate processing apparatus 1, the identification information of the faulty processing unit 110, the version information of the programs and the identification code of the alarm are added to the request command transmitted for acquiring the latest countermeasure information 363 in the aforementioned embodiment, the present invention is not restricted to this. It is also possible to selectively acquire proper latest countermeasure information 363 by adding only the file name to the request command if the file name of the countermeasure information is structured to be capable of univocally deriving the identification information of the substrate processing apparatus 1, the identification information of the processing unit 110, the version information of the programs and the identification code of the alarm, for example.

While only the countermeasure information 363 is acquired from the support computer 3 as the additional information in the aforementioned embodiment, any information such as information related to the specification of the substrate processing apparatus 1, information related to an operating method or information related to a substrate processing method is employable so far as the same is additional information for the substrate processing apparatus 1.

3. Third Embodiment

The schematic structure of a substrate processing system 10 according to a third embodiment of the present invention is identical to that shown in FIG. 1. In the substrate processing system 10 according to the third embodiment, however, an information storage server 2 stores version information of software modules mounted on a substrate processing apparatus 1, so that the stored version information can be read in a support computer 3 through a network 6.

The structure of the substrate processing apparatus 1 is identical to that of the first embodiment described with reference to FIGS. 2 and 3. However, a storage part 104 of a system control part 100 according to the third embodiment stores the software module which is a system control program related to the overall apparatus 1. It follows that a CPU 101 of the system control part 100 executes arithmetic operation according to this software module, thereby implementing operation control or data processing of the substrate processing apparatus 1 as a whole. A storage part 114 of a unit control part 115 stores a software module which is a unit control program responsive to the contents of processing of a substrate processing part 116 of each processing unit 110. It follows that a CPU 111 of the unit control part 115 executes arithmetic operation according to the software module, thereby implementing operation control or data processing of the substrate processing part 116.

In other words, control programs mounted on the substrate processing apparatus 1 are divided into some software modules and stored in the storage part 104 of the system control part 100 and the storage part 114 of the unit control part 115, and each software module is a divided body of such control software for the substrate processing apparatus 1.

These software modules can be acquired and updated by reading from a recording medium 91 through a reader 150 or downloading from a prescribed server or the like through the network 6.

The structures of the information storage server 2 arranged on a substrate processing factory 4 and the support computer 3 arranged on a support center 5 are identical to those of the first embodiment described with reference to FIG. 4.

Figure 14:
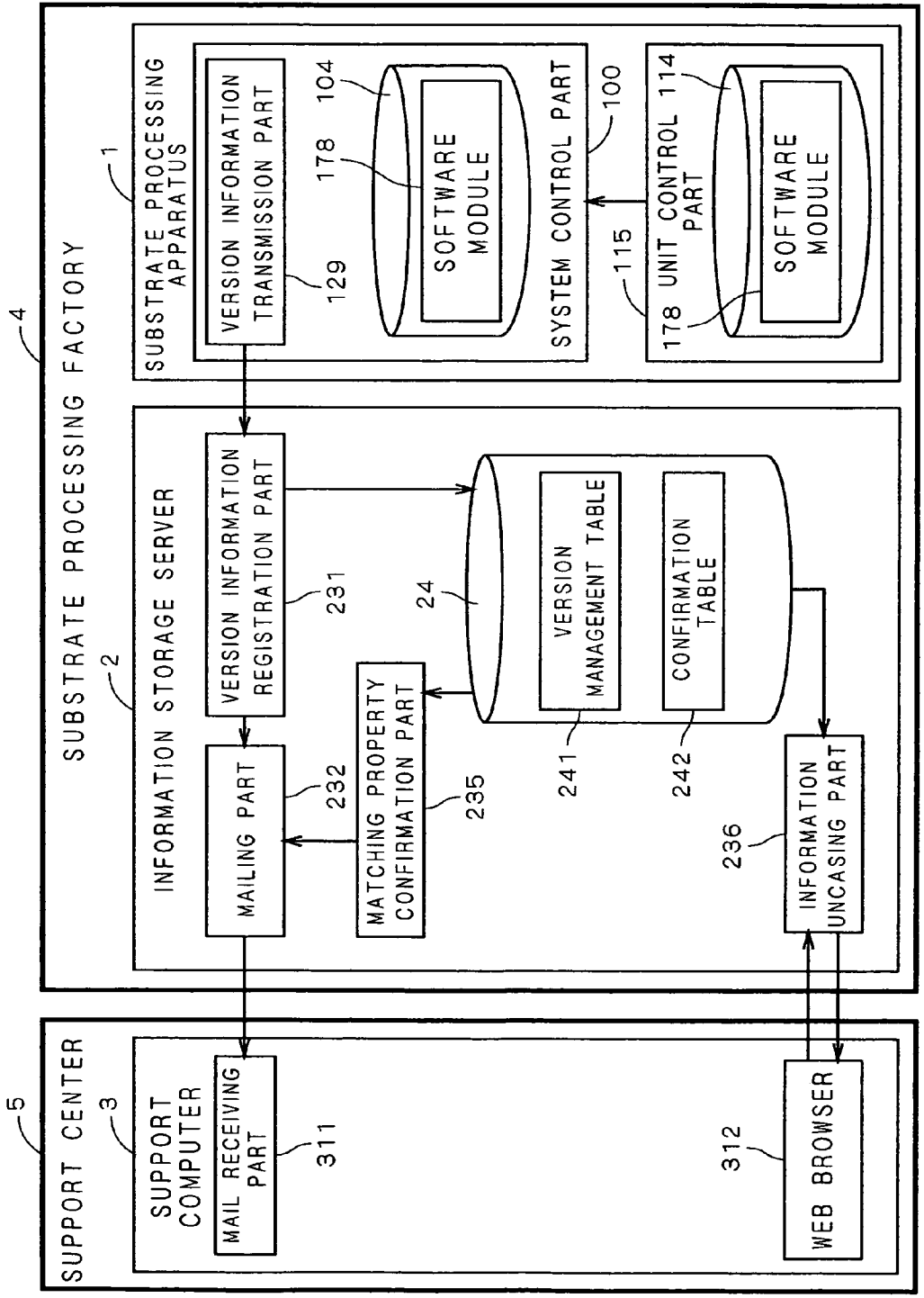
FIG. 14 illustrates an exemplary functional structure of a substrate processing system according to a third embodiment of the present invention.

Functions and processing contents of the substrate processing system 10 are now described. FIG. 14 is a block diagram showing the functional structure of the substrate processing system 10 according to the third embodiment. FIG. 15 is a flow chart showing the procedure in the substrate processing system 10 according to the third embodiment. Referring to FIG. 14, a version information transmission part 129 is a processing part implemented by the CPU 101 of the system control part 100 running a processing program (software module), a version information registration part 231, a mailing part 232, a matching property confirmation part 235 and an information uncasing part 236 are processing parts implemented by a CPU 21 of the information storage server 2 running processing programs respectively, and a mail receiving part 311 and a WEB browser 312 are processing parts implemented by the CPU 31 of the support computer 3 running processing programs respectively.

First, software modules 178 are installed in the substrate processing apparatus 1 at a step S1 in FIG. 15. As hereinabove described, the software modules 178 are divided bodies of the control software for the substrate processing apparatus 1, and installed in the system control part 100 and/or the unit control part 115 of the substrate processing apparatus 1. More specifically, the software modules 178 are installed through the reader 150 of the substrate processing apparatus 1, so that the storage part 104 stores the software module 178 installed in the system control part 100 and the storage part 114 15 stores the software module 178 installed in the unit control part 115.

Installation of the software modules 178 in this embodiment also includes a case of updating the already mounted software modules 178 in addition to a case of newly introducing the software modules 178. The software modules 178 may be simultaneously installed in all system control parts 100 and unit control parts 115 included in the substrate processing apparatus 1 or may be installed any (one or ones) thereof.

When the software module 178 is installed in at least either the system control part 100 or the unit control part 115, the version information transmission part 129 intensively transmits version information to the information storage server 2 (step S2). In other words, the version information transmission part 129 directly recognizes the installation when the software module 178 is installed in the system control part 100. When the software module 178 is installed in the unit control part 115, on the other hand, the version information transmission part 129 receiving a self-report from the unit control part 115 recognizes the installation. The version information transmission part 129 recognizing installation of the software module 178 in at least the system control part 100 or the unit control part 115 in a certain substrate processing apparatus 1 intensively transmits version information of software modules 178 presently installed in the system control part 100 and all unit control parts 115 to the version information registration part 231 of the information storage server 2.

The version information registration part 231 receiving the version information registers the version information of the software modules 178 installed in the system control part 100 and all unit control parts 115 included in the aforementioned substrate processing apparatus 1 in a hard disk 24 (step S3). The hard disk 24 stores version information as to each substrate processing apparatus 1 as a version management table 241.

FIG. 16 illustrates an exemplary version management table 241. Referring to FIG. 16, "apparatus" denotes an identification number supplied to each substrate processing apparatus 1, "system version" denotes the version of the overall system mounted on the substrate processing apparatus 1, and "date of installation" denotes the date of installation of the software module 178 in at least the system control part 100 or the unit control part 115. Further, "category" denotes the type of the installed software module 178, "version classification" denotes whether the installed software module 178 is of a standard specification or a custom-built specification, and "version" denotes the version information of the installed software module 178.

As shown in FIG. 16, the version management table 241 registers the version information every substrate processing apparatus 1 arranged on the substrate processing factory 4. As to a substrate processing apparatus 1 having an apparatus number "8101", for example, the version management table 241 records that the software module 178 was installed on Apr. 12, 2001 as a system version "1.00". The version management table 241 also records that the version of the software module 178 is "1.0.0.1" as the version information of the software module 178 (category: "system control") installed in the system control part 100 of the substrate processing apparatus 1 having the apparatus number "8101". The version management table 241 further registers that the version classification of the software module 178 is "standard".

As the version information of the software modules 178 (categories: "spin control", "chemical solution control" etc.) installed in the unit control part 115 of the substrate processing apparatus 1 having the apparatus number "8101", further, the version management table 241 registers that the versions of the software modules 178 are "1.1.0.1" and "1.0.0.3" respectively. The version management table 241 also registers that the version classifications of the software modules 178 are "standard" and "custom-built E" respectively.

Similarly as to a substrate processing apparatus 1 having an apparatus number "8100", the version management table 241 records that the software module 178 was installed on Apr. 12, 2001 as the system version "1.00" and thereafter another software module 178 was installed on Apr. 20, 2001 as a system version "1.10". That is, the version management table 241 records not only the current version information but also the past version history every substrate processing apparatus 1. In other words, the hard disk 24 according to this embodiment functions as version information storage means storing the version information of the software modules 178 installed in the system control part 100 and the unit control part 115.

The version management table 241 shown in FIG. 16 is constructed as a result of integrating the version information of the software modules 178 presently installed in the system control part 100 and all unit control parts 115 when any software module 178 is installed in the substrate processing apparatus 1. Assuming that the new software module (version: "1.0.0.3") for chemical solution control was installed in the substrate processing apparatus 1 having the apparatus number "8101" on Apr. 12, 2001, for example, the hard disk 24 stores the version information of the software modules 178 installed in the system control part 100 and all unit control parts 115 included in the substrate processing apparatus 1 having the apparatus number "8101" at this date, to construct the version management table 241 shown in FIG. 16.

On the other hand, the version information registration part 231 registers the version information of the software module 178 in the hard disk 24 while posting this registration to the mailing part 232. The mailing part 232 recognizing the registration of the version information of the software module 178 in the hard disk 24 submits e-mail describing this registration of the new version to the support computer 3 of the support center 5 through the network 6 (step S4 in FIG. 15). When the mail receiving part 311 of the support computer 3 receives the e-mail related to the registration of the new version, the person in charge in the support center 5 can recognize that the software module 178 has been installed in the substrate processing apparatus 1 from the support computer 3.

Then, the process advances to a step S5 in FIG. 15, so that the matching property confirmation part 235 of the information storage server 2 checks the matching property of the newly installed software module 178. More correctly, the matching property confirmation part 235 refers to the version information of the software modules 178 installed in the system control part 100 and the unit control part 115 stored in the hard disk 24 when the software module 178 is installed in the system control part 100 or the unit control part 115 and confirms the mutual matching properties of the software modules 178 installed in the system control part 100 and the unit control part 115 respectively at that time (immediately after the installation). If the software module 178 is partially updated, it follows that the matching property confirmation part 235 confirms the mutual matching properties of the installed software module 178 and the software modules 178 already installed in the system control part 100 and the unit control part 115. The method of this confirmation is more specifically described.

When a software module 178 is installed in the system control part 100 or the unit control part 115 of a certain substrate processing apparatus 1, the matching property confirmation part 235 can recognize the version information of the software modules 178 installed in the system control part 100 and the unit control part 115 respectively at that time (immediately after the installation) by referring to the version management table 241. Assuming that the new software module (version: "1.0.0.3") for chemical solution control is installed in the unit control part 115 of the substrate processing apparatus 1 having the apparatus number "8101", for example, the matching property confirmation part 235 can recognize that the version information of the software module 178 (category: "system control") presently installed in the system control part 100 is "1.0.0.1" and the version information of the software modules 178 (categories: "spin control" and "chemical control ") in the unit control part 115 is "1.1.0.1" and "1.0.0.3" respectively by referring to the version management table 241 shown in FIG. 16.

The hard disk 24 of the information storage server 2 stores a confirmation table 242. FIG. 17 illustrates an exemplary confirmation table 242. Referring to FIG. 17, the meanings of "system version", "category", "version classification" and "version" are identical to those described with reference to FIG. 16. "Release information" is a comment statement as to each system version. The confirmation table 242 is prepared every system version, and FIG. 17 shows the confirmation table 242 as to the system version "1.00".

The confirmation table 242 is a matching property confirmation table registering version information of software modules 178 mutually having matching properties, and the hard disk 24 also functions as table holding means holding such a matching property confirmation table 242. According to the confirmation table 242 shown in FIG. 17, it is confirmed that the software modules 178 (version: "1.1.0.1" and "1.1.0.2") of the category "spin control" and the software module 178 (version: "1.0.0.3") of the category "chemical solution control" etc. mutually have matching properties as to the software module 178 (version: "1.0.0.1") of the category "system control" in the system version "1.00". At the same time, these software modules 178 mutually have matching properties also as to the software module 178 (version: "1.0.0.2") of the category "system control". That is, if the confirmation table 242 registers all version information of the software modules 178 installed in the system control part 100 and the unit control part 115 of a certain substrate processing apparatus 1, it follows that these software modules 178 mutually have matching properties.

Such a confirmation table 242, created and distributed by the maker of the substrate processing apparatus 1, is distributed from the support computer 3 of the support center 5 to the information storage server 2 of the substrate processing factory 4 through the network 6 in this embodiment.

When a software module 178 is installed in the system control part 100 or the unit control part 115 of a certain substrate processing apparatus 1, the matching property confirmation part 235 confirms whether or not the confirmation table 242 shown in FIG. 17 registers all version information of the software modules 178 installed in the system control part 100 and the unit control part 115 recognized by referring to the version management table 241. Consequently, the matching property confirmation part 235 determines matching if the confirmation table 242 registers all version information of the software modules 178 installed in the system control part 100 and the unit control part 115, while determining mismatching if the confirmation table 242 does not register any one of these (step S6 in FIG. 15).

In the aforementioned case of installing the new software module 178 "version:" 1.0.0.3) for the category "chemical solution control" in the unit control part 115 of the substrate processing apparatus 1 having the apparatus number "8101", for example, the version information of the software module 178 (category: "system control") installed in the system control part 100 of the substrate processing apparatus 1 is the version "1.0.0.1", and the version information of the software modules 178 (categories: "spin control" and "chemical solution control" or the like) installed in the unit control part 115 is the versions "1.1.0.1" and "1.0.0.3" respectively (FIG. 16). The confirmation table 242 (system version: "1.00") shown in FIG. 17 registers all version information of these software modules 178, and hence the matching property confirmation part 235 determines that the newly installed software module 178 (category: "chemical solution control", version: "1.0.0.3") matches with the software module 178 already installed in the system control part 100 and the unit control part 115.

When the matching property confirmation part 235 determines matching as described above, a series of processing following the installation of the new software module 178 is terminated. On the other hand, the matching property confirmation part 235 may determine mismatching.

For example, it is assumed that a new software module (version classification: "custom-built F", version: "1.0.0.4") of the category "chemical solution control" is installed in the unit control part 115 of the substrate processing apparatus 1 having the apparatus number "8101". In this case, the hard disk 24 stores the version information of the software modules 178 installed in the system control part 100 and all unit control parts 115 included in the substrate processing apparatus 1 having the apparatus number "8101" at the time of the installation similarly to the above, for constructing a version management table 241 shown in FIG. 18.

In this case, the matching property confirmation part 235 refers to the version management table 241 shown in FIG. 18 thereby recognizing that the version information of the software module 178 (category: "system control") installed in the system control part 100 is the version "1.0.0.1" and the version information of the software modules 178 (categories: "spin control" and "chemical solution control" or the like) is the versions "1.1.0.1" and "1.0.0.4" respectively. The confirmation table 242 (system version: "1.00") shown in FIG. 17 does not register the version "1.0.0.4" of the software module 178 (category: "chemical solution control") installed in the unit control part 115 among the version information, and hence the matching property confirmation part 235 determines that the newly installed software module 178 does not match with the software module 178 already installed in the system control part 100 and the unit control part 115.

When determining mismatching, the matching property confirmation part 235 posts this mismatching to the mailing part 232 for submitting e-mail describing a mismatch notice to the support computer 3 of the support center 5 through the network 6 (step S7 in FIG. 15). When the mail receiving part 311 receives the e-mail describing the mismatch notice, the person in charge of the support center 5 recognizes that the software module 178 installed in the substrate processing apparatus 1 is mismatching.

In this case, the person in charge of the support center 5 confirms the version information through the WEB browser 312 (step S8 in FIG. 15). The information uncasing part 236 uncases the version management table 241 stored in the hard disk 24 of the information storage server 2 to be readable through the network 6. The person in charge of the support center 5 reads the version management table 241 stored in the hard disk 24 through the WEB browser 312 and confirms the version information of the software module 178 installed in the substrate processing apparatus 1. The person in charge of the support center 5 finds out the mismatching software module 178 and posts this to the operator of the substrate processing factory 4 or the field service engineer through e-mail or the like, to eliminate the mismatching.

Thus, when a software module 178 is installed in the system control part 100 or the unit control par 115 of a certain substrate processing apparatus 1, the matching properties between the software modules 178 presently installed in the system control part 100 and the unit control part 115 are so confirmed that a failure (malfunction or stoppage of the substrate processing apparatus 1) resulting from mismatching between the software modules 178 can be prevented. If a partial software module 178 is updated, it follows that matching properties between the newly installed software module 178 and the software modules 178 already installed in the system control part 100 and the unit control part 115 are so confirmed that a failure resulting from mismatching between the software modules 178 can be prevented.

The version management table 241 stores the version information of all software modules 178 installed in the system control part 100 and the unit control parts 115 included in a substrate processing apparatus 1 regardless of matching properties between the software modules 178 and uncases the same to be readable through the network 6, whereby the support center 5 can quickly and correctly grasp the version information of the software modules 178 installed in the substrate processing apparatus 1 for efficiently analyzing the cause of a failure.

The third embodiment is not restricted to the above. For example, the information storage server 2 is arranged in the substrate processing factory 4 in the third embodiment, while the present invention is not restricted to this but the information storage server 2 may be arranged on any place so far as the same is connected to the network 6 to be capable of making communication with the substrate processing apparatus 1 and the support computer 3.

Figure 19:
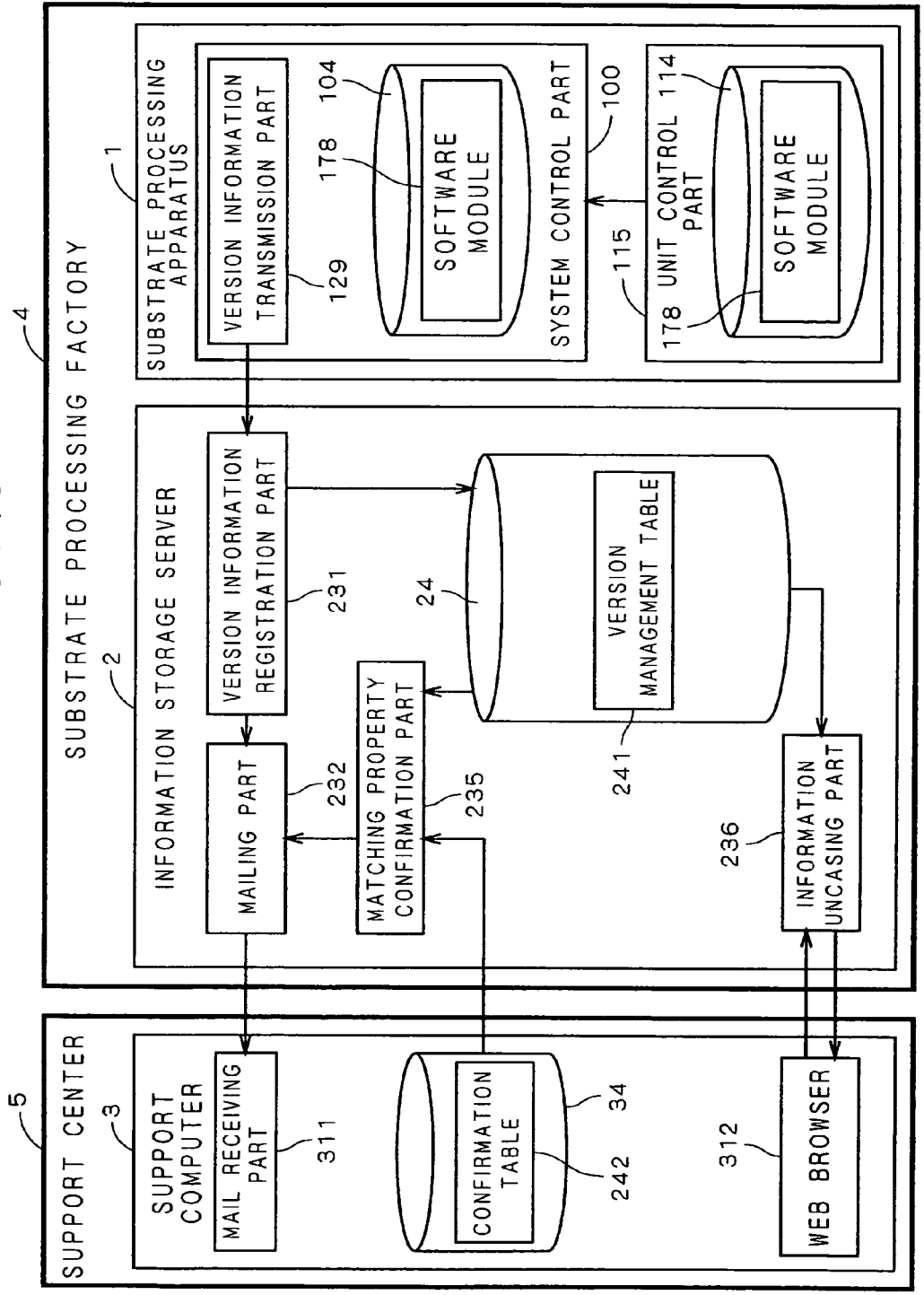
FIG. 19 illustrates another exemplary functional structure of the substrate processing system according to the third embodiment.

While the confirmation table 242 is distributed from the support compute 3 and stored in the hard disk 24 of the information storage server 2 in the third embodiment, the confirmation table 242 may alternatively be stored in the hard disk 34 of the support computer 3. FIG. 19 is a functional block diagram showing the functional structure of a substrate processing system 10 storing a confirmation table 242 in a hard disk 34 of a support computer 3. In this case, the maker of a substrate processing apparatus 1 does not distribute the created confirmation table 242 but stores the same in the hard disk 34 of the support computer 3, and uncases the same to be readable through a network 6. A matching property confirmation part 235 of an information storage server 2 checks the matching properties between the aforementioned software modules 178 while referring to the confirmation table 242 through the network 6. The remaining points of this structure are identical to those of the aforementioned embodiment. The same effect as the aforementioned embodiment can be attained also in this case.

Figure 20:
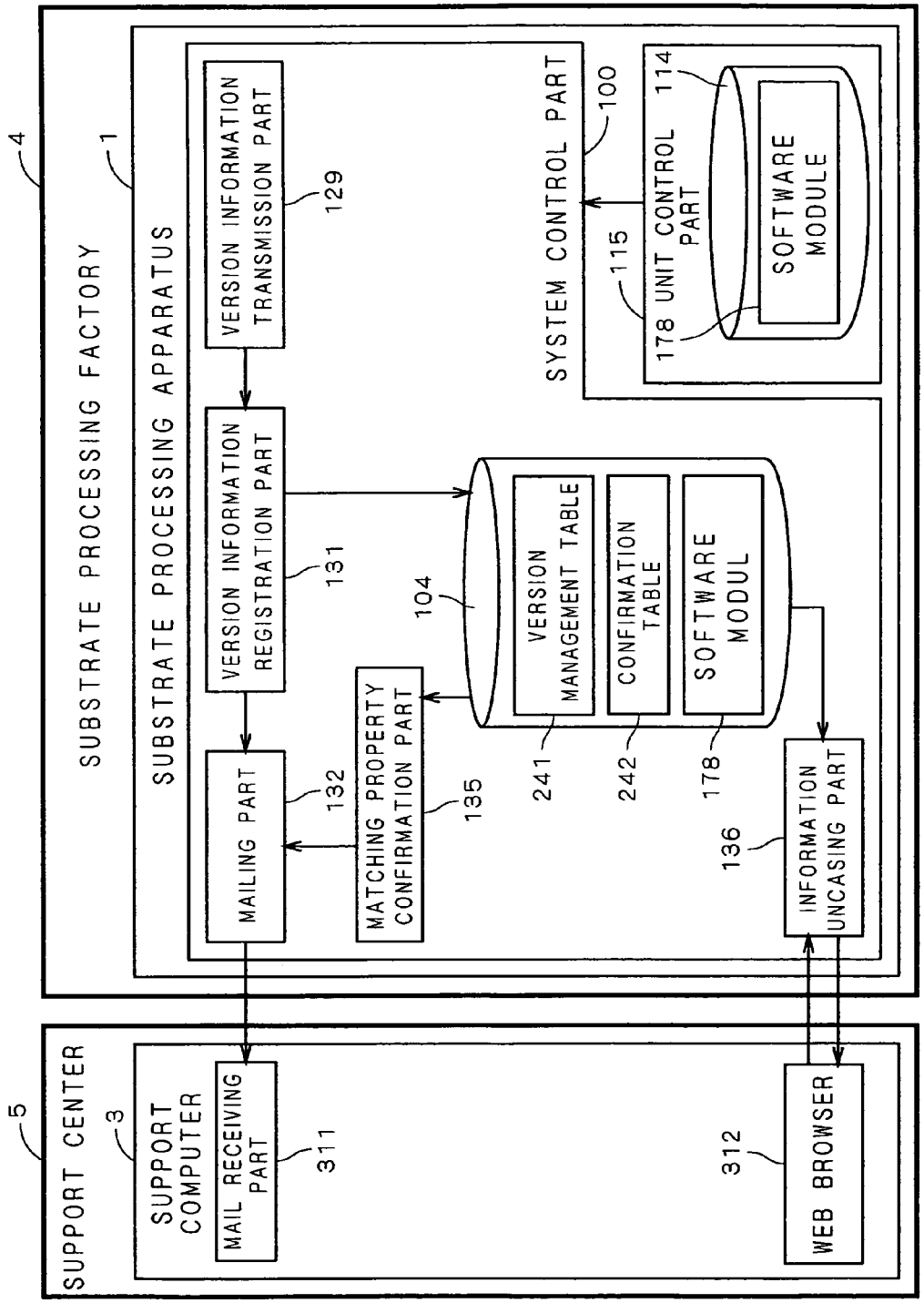
FIG. 20 illustrates still another exemplary functional structure of the substrate processing system according to the third embodiment.

The substrate processing apparatus 1 may alternatively have the processing function of the information storage server 2. FIG. 20 is a functional block diagram showing the functional structure of a substrate processing system 10 provided with a substrate processing apparatus 1 having the processing function of the information storage server 2. Referring to FIG. 20, parts identical in function to those in FIG. 14 are denoted by the same reference numerals. Referring to FIG. 20, a version information transmission part 129, a version information registration part 131, a mailing part 132, a matching property confirmation part 135 and an information uncasing part 136 are processing parts implemented by a CPU 101 of a system control part 100 running processing programs (software modules).

In the case of FIG. 20, it follows that a storage part 104 of the system control part 100 stores a version management table 241 and a confirmation table 242 in addition to a software module 178. The version information registration part 131, the mailing part 132, the matching property confirmation part 135 and the information uncasing part 136 of the system control part 100 have functions similar to those of the version information registration part 231, the mailing part 232, the matching property confirmation part 235 and the information uncasing part 236 of the information storage server 2 of the aforementioned embodiment respectively and perform similar processing. The same effect as the aforementioned embodiment can be attained also in this case.

Epitomizing the technical contents related to the present invention, any of the substrate processing apparatus 1, the information storage server 2 and the support computer 3 may perform each processing so far as the same constructs the version management table 241 by storing the version information of the software modules 178 presently installed in the system control part 100 and the unit control part 115 immediately after installation when a software module 178 is installed in the system control part 100 or the unit control part 115 of the substrate processing apparatus 1 while confirming the matching properties between the software modules 178 installed in the system control part 100 and the unit control part 115 respectively from the version management table 241 by referring to the confirmation table 242 registering the version information of the software modules 178 having matching properties. The person in charge of the support center 5 receiving information of new version registration through e-mail may alternatively confirm the matching properties.

While the substrate processing apparatus according to each of the aforementioned embodiments performs resist coating and development on substrates, the present invention is not restricted to this but the technique according to the present invention is applicable to any substrate processing apparatus such as a lamp annealing apparatus heating substrates by photo-irradiation, a cleaning apparatus performing cleaning of removing particles while rotating substrates, a dipping apparatus dipping substrates in a processing solution such as hydrofluoric acid for performing surface treatment or the like so far as the same performs prescribed processing on substrates.

While the invention has been shown and described in detail, the foregoing description is in all aspects illustrative and not restrictive. It is therefore understood that numerous modifications and variations can be devised without departing from the scope of the invention.

What is claimed is:

1. A substrate processing system comprising a substrate processing apparatus capable of making communication through a network, comprising:
   an additional information accumulator accumulating additional information, relevant to said substrate processing apparatus, additionally distributed by a vendor of said substrate processing apparatus, said additional information includes countermeasure information against a failure of said substrate processing apparatus;
   a warning element generating a warning signal when said substrate processing apparatus causes said failure;
   a table storage element storing a table associating said warning signal with said countermeasure information against said failure resulting in said warning signal;
   an additional information acquisition element acquiring said accumulated additional information through said network, wherein said additional information acquisition element selectively acquires updated countermeasure information against said failure resulting in generated said warning signal from said accumulated information in said additional information accumulator; and
   an additional information storage element storing said additional information acquired by said additional information acquisition element, and a date on which said additional information is acquired.

2. The substrate processing system according to claim 1, further comprising a display element displaying said countermeasure information against said failure resulting in said warning signal when said warning signal is generated.

3. A substrate processing apparatus capable of making communication through a network, comprising:
   a warning element generating a warning signal when said substrate processing apparatus causes said failure;
   a table storage element storing a table associating said warning signal with said countermeasure information against said failure resulting in said warning signal;
   an additional information acquisition element acquiring additional information from an accumulator through said network, said additional information being relevant to said substrate processing apparatus and additionally distributed by a vendor of said substrate processing apparatus, wherein said additional information includes countermeasure information against a failure of said substrate processing apparatus and said additional information acquisition element selectively acquires updated countermeasure information against said failure resulting in generated said warning signal from information accumulated in said accumulator; and
   an additional information storage element storing said additional information acquired by said additional information acquisition element, and a date on which said additional information is acquired.

4. The substrate processing apparatus according to claim 3, further comprising a display element displaying said countermeasure information against said failure resulting in said warning signal when said warning signal is generated.

5. A method of acquiring additional information relevant to a substrate processing apparatus in a system including a computer connected with said substrate processing apparatus through a network, comprising:
   an additional information accumulating step performed in a predetermined operation of said computer to accumulate said additional information, said additional information includes countermeasure information against a failure of said substrate processing apparatus;

a warning step generating a warning signal when said substrate processing apparatus causes said failure;

an additional information acquisition step of said substrate processing apparatus acquiring said additional information accumulated in said computer through a said network; and an additional information storage step of said substrate processing apparatus storing said acquired additional information in a predetermined storage element; and wherein said additional information acquisition step selectively acquires updated countermeasure information against said failure resulting in said warning signal based on a table associating said warning signal with said countermeasure information against said failure resulting in said warning signal.

6. A computer included in a substrate processing apparatus, said computer including a program of computer executable instruction, wherein execution of said program by said computer enables said substrate processing apparatus to acquire additional information, relevant to said substrate processing apparatus, said additional information includes countermeasure information against a failure of said substrate processing apparatus, additionally distributed by a vendor of said substrate processing apparatus, said program further enabling said substrate processing apparatus to generate a warning signal when said substrate processing apparatus causes said failure, said program still further enabling said substrate processing apparatus to store said acquired additional information and a date on which said additional information is acquired, and enabling said substrate processing apparatus to selectively acquire updated countermeasure information against said failure resulting in said warning signal based on a table associating said warning signal with said countermeasure information against said failure resulting in said warning signal.

7. A computer-readable recording medium on which a program of instructions for a computer included in a substrate processing apparatus, wherein execution of said program by said computer enables said substrate processing apparatus to acquire additional information, relevant to said substrate processing apparatus, said additional information includes countermeasure information against a failure of said substrate processing apparatus, additionally distributed by a vendor of said substrate processing apparatus, said program further enabling said substrate processing apparatus to generate a warning signal when said substrate processing apparatus causes said failure, said program still further enabling said substrate processing apparatus to store said acquired additional information and a date on which said additional information is acquired, and enabling said substrate processing apparatus to selectively acquire updated countermeasure information against said failure resulting in said warning signal based on a table associating said warning signal with said countermeasure information against said failure resulting in said warning signal.

8. A substrate processing system comprising:

a substrate processing apparatus performing prescribed processing on a substrate; and a computer connected with said substrate processing apparatus through a network to be capable of making communication;

said computer comprising an additional information accumulator accumulating additional information, relevant to said substrate processing apparatus and additionally distributed by a vendor of said substrate processing apparatus, said additional information includes countermeasure information against a failure of said substrate processing apparatus, and said substrate processing apparatus comprising:

a warning element generating a warning signal when said substrate processing apparatus causes said failure;

a table storage element storing a table associating said warning signal with said countermeasure information against said failure resulting in said warning signal, an additional information acquisition element acquiring accumulated said additional information through said network, said additional information acquisition element selectively acquires updated countermeasure information against said failure resulting in generated said warning signal from accumulated information in said additional information accumulator; an additional information storage element storing said additional information acquired by said additional information acquisition element and a selection element selecting whether or not to acquire said additional information through said additional information acquisition element.

9. A substrate processing apparatus capable of making communication through a network, comprising:

a warning element generating a warning signal when said substrate processing apparatus causes said failure;

a table storage element storing a table associating said warning signal with said countermeasure information against said failure resulting in said warning signal, an additional information acquisition element acquiring additional information from an accumulator through said network, said additional information being relevant to said substrate processing apparatus and additionally distributed by a vendor of said substrate processing apparatus, said additional information includes countermeasure information against said failure of said substrate processing apparatus, said additional information acquisition element selectively acquires updated countermeasure information against said failure resulting in generated said warning signal from accumulated information in said accumulator;

an additional information storage element storing said additional information acquired by said additional information acquisition element; and a selection element selecting whether or not to acquire said additional information through said additional information acquisition element.

* * * * *